(12) United States Patent
Chen et al.

(10) Patent No.: US 11,903,171 B2
(45) Date of Patent: Feb. 13, 2024

(54) SYSTEM FOR MODULAR LIQUID SPRAY COOLING OF ELECTRONIC DEVICES

(71) Applicants: Nan Chen, Greenville, SC (US); He Zhao, Flagstaff Hill (AU); Yunshui Chen, San Ramon, CA (US)

(72) Inventors: Nan Chen, Greenville, SC (US); He Zhao, Flagstaff Hill (AU); Yunshui Chen, San Ramon, CA (US)

( * ) Notice: Subject to any disclaimer, the term of this patent is extended or adjusted under 35 U.S.C. 154(b) by 1 day.

(21) Appl. No.: 17/880,866

(22) Filed: Aug. 4, 2022

(65) Prior Publication Data
US 2023/0045752 A1    Feb. 9, 2023

Related U.S. Application Data

(60) Provisional application No. 63/229,821, filed on Aug. 5, 2021.

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |

(52) U.S. Cl.
CPC ..... *H05K 7/20809* (2013.01); *H05K 7/20327* (2013.01); *H05K 7/20345* (2013.01)

(58) Field of Classification Search
CPC ........... H05K 7/20809; H05K 7/20327; H05K 7/20345; H05K 7/208; H05K 7/20772; H05K 7/20763; H05K 7/2029
See application file for complete search history.

(56) References Cited

U.S. PATENT DOCUMENTS

| | | | | |
|---|---|---|---|---|
| 5,768,103 A * | 6/1998 | Kobrinetz | ........... | H01L 23/4735 174/15.1 |
| 6,205,799 B1 * | 3/2001 | Patel | .................. | H05K 7/20345 236/46 F |
| 2002/0113142 A1 * | 8/2002 | Patel | .................. | H01L 23/4735 239/128 |
| 2002/0163782 A1 * | 11/2002 | Cole | .................. | H05K 7/20345 361/700 |
| 2005/0185378 A1 * | 8/2005 | Tilton | ................ | H05K 7/20345 361/699 |
| 2006/0104031 A1 * | 5/2006 | Colgan | ............... | H01L 23/4735 361/699 |

(Continued)

*Primary Examiner* — Anthony M Haughton
(74) *Attorney, Agent, or Firm* — Ariel S. Bentolila; Bay Area IP Group, LLC

(57) ABSTRACT

A system including a heat exchanger section for re-cooling a heated liquid coolant, a spray cooling section for cooling an electronic equipment; mean for separating said heat exchanger or pump section from said spray cooling section; means for transferring heat generated by the electronic equipment to at least liquid coolant; means for spraying the liquid coolant along the heat transferring means to transfer heat from the electronic equipment to the liquid coolant; wherein the heat transferring means is in an essentially vertical position so that the liquid coolant generally flows downward and is drained by gravity; means for collecting the liquid coolant; means for suctioning the collected liquid coolant; means for pumping the dielectric liquid coolant from the sprayed liquid coolant collecting means and through the liquid coolant spraying means; and means for housing the system.

20 Claims, 14 Drawing Sheets

(56) References Cited

U.S. PATENT DOCUMENTS

| | | | | |
|---|---|---|---|---|
| 2011/0277491 A1* | 11/2011 | Wu | ............... | F28D 15/0266 |
| | | | | 62/177 |
| 2014/0204532 A1* | 7/2014 | Mehring | ............ | H05K 7/20345 |
| | | | | 361/689 |
| 2016/0037680 A1* | 2/2016 | Hou | ................ | H05K 7/20345 |
| | | | | 361/699 |
| 2016/0116217 A1* | 4/2016 | Law | ................ | H01L 24/75 |
| | | | | 239/69 |
| 2020/0105645 A1* | 4/2020 | Mydlarski | ............ | H01L 23/4735 |
| 2021/0348624 A1* | 11/2021 | Diglio | .................. | F04D 29/588 |
| 2021/0351108 A1* | 11/2021 | Diglio | ................ | H01L 23/4735 |

* cited by examiner

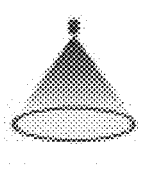
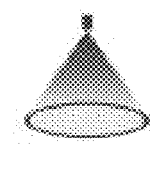
Figure 4A                Figure 4B                Figure 4C
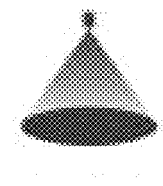
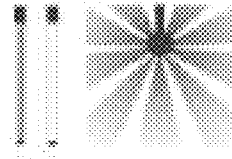
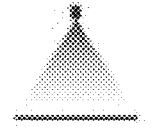
Figure 4D                Figure 4E                Figure 4F

SYSTEM FOR MODULAR LIQUID SPRAY COOLING OF ELECTRONIC DEVICES

CROSS-REFERENCE TO RELATED APPLICATIONS

The present Utility patent application claims priority benefit of the [U.S. provisional application for patent Ser. No. 63/229,821 entitled "Modular liquid spray cooling cell of electronic devices", filed on 5 Aug. 2021 under 35 U.S.C. 119(e). The contents of this related provisional application are incorporated herein by reference for all purposes to the extent that such subject matter is not inconsistent herewith or limiting hereof.

FEDERALLY SPONSORED RESEARCH OR DEVELOPMENT

Not applicable.

REFERENCE TO SEQUENCE LISTING, A TABLE, OR A COMPUTER LISTING APPENDIX

Not applicable.

COPYRIGHT NOTICE

A portion of the disclosure of this patent document contains material that is subject to copyright protection by the author thereof. The copyright owner has no objection to the facsimile reproduction by anyone of the patent document or patent disclosure for the purposes of referencing as patent prior art, as it appears in the Patent and Trademark Office, patent file or records, but otherwise reserves all copyright rights whatsoever.

BACKGROUND OF THE RELEVANT PRIOR ART

One or more embodiments of the invention generally relate to cooling systems. More particularly, certain embodiments of the invention relate to cooling systems for electronic devices incorporating the spraying of liquid coolant in a longitudinal direction along heat sink(s).

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon. IT equipment technology change has often been a primary driver in the development of infrastructure cooling solutions. Although liquid cooling has been deployed for many years in mainframes and high-performance computing (HPC), today's demands of cloud, IoT, AI, and edge applications are once again resulting in IT technology changes and driving a renewed look at liquid cooling and the development of new technologies. Increasing focus on data center energy efficiency and sustainability is also placing increased pressure on the data center industry to develop and adopt efficient cooling infrastructure like liquid cooling.

The predominate way to remove heat from IT equipment is by airflow through the chassis of the equipment. For typical servers, 70-80% of the heat is generated by the CPU, with the remaining heat from peripherals like memory, power supply, hard drives, SSD, etc. The increasing use of Graphics Processing Units (GPUs) has further increased the heat generated within the IT chassis. A GPU can generate over 400 watts, but high core count CPUs, like the latest Intel Xeon processor are now also generating 400 watts. Liquids have a much greater capacity to capture heat by unit volume. This allows liquid cooling technologies to remove heat more efficiently than air cooling and may enable the chips to work harder (i.e., increased clock speed). Additionally, the heat may be rejected to the atmosphere either via dry coolers or, in the case of hotter environments, cooling towers. In some systems the heat may be reused elsewhere such as district heating.

Liquid cooling is not new to data center applications. It can be traced back to the 1960s when it was used in IBM mainframes to solve the cooling challenges for solid state devices which were densely packed and had lower allowable operating temperatures. However, the introduction of complementary metal oxide semiconductor (CMOS) technology in the early 1990s replaced bipolar semiconductor technology, which reduced power consumption. As a result, convective airflow cooling again became the default cooling option for IT equipment. Convective airflow cooling is still dominant in data centers, but there is broader adoption of liquid cooling in gaming, blockchain mining, and HPC applications, which typically require greater compute capacity with special servers. Liquid cooling has not seen broader adoption across the data center industry, largely because the compute demand has been met with increasing the number of logical cores that stay within reasonable power limits.

There are two main categories of liquid cooling—direct to chip (sometimes called conductive or cold plate) and immersive. From these two categories come a total of five main liquid cooling methods, single-phase direct to chip liquid cooling where the coolant does not undergo a phase change, two-phase direct to chip liquid cooling where the coolant changes from one state to another (e.g., from liquid to gas), single-phase immersive liquid cooling within the IT chassis, single-phase immersive liquid cooling within a tub, and two-phase immersive liquid cooling within a tub. Direct to chip is where the liquid coolant is in contact with the hotter components (CPUs or GPUs) through a cold plate on the components within the server. The electronic components of the IT are not in direct physical contact with the liquid coolant. Some designs also include cold plates around memory modules. With this method, fans are still required to provide airflow through the server to remove residual heat. In single-phase direct to chip applications, the fluid does not change state while removing the heat. For single-phase direct to chip cooling, mainly single-phase water-based coolants are used, but some designs may use engineered dielectric fluids. In two-phase direct to chip liquid cooling the fluid used as the liquid coolant is two-phase which means the fluid changes from one state to another (e.g., from liquid to gas) when removing the heat. Two-phase is typically better than single-phase in terms of heat rejection; however two-phase may require additional system controls to ensure proper operation. For two-phase direct to chip liquid cooling, engineered dielectric fluid is typically used as the coolant. This eliminates the risk of water exposure to the IT equipment. The dielectric vapor present after the fluid goes through phase change can be transported to a condenser outside or reject its heat to a building water loop. With immersive liquid cooling, the liquid coolant is in direct physical contact with the IT electronic components. The servers are fully or partially immersed in a dielectric liquid coolant covering the board and the components, which typically ensures all sources of heat are removed. This approach uses a single-phase dielectric. With immersive liquid cooling, all fans within the server can be removed, and all electronics are placed in an environment which is inherently slow to react to any external changes in temperature and renders it immune to the influence of humidity and pollutants. Heat exchangers and pumps can be located inside of the server or in a side arrangement where the heat is transferred from the dielectric coolant to a water loop. With the tub method, also referred to as open bath, the IT equipment is completely submerged in the fluid. With traditional IT racks, the servers are typically horizontally stacked from the bottom to the top of a rack. However, because this method uses a tub, it is like laying a traditional rack of servers on its back. Instead of pulling servers out on a horizonal plane, tub immersive servers are pulled up and out on a vertical plane. Many times, this method incorporates centralized power supplies to provide power to all the servers within the tub. The heat within the dielectric fluid is transferred to a water loop via a heat exchanger using a pump or natural convection. This method typically uses oil-based dielectric as the fluid. Note that the heat exchanger may be installed inside or outside the tub. In a two-phase tub method, the IT is completely submerged in the fluid. The difference between a single-phase tub method and this method is the two-phase dielectric coolant. Again, this means the fluid changes from one state to another in removing the heat. For example, the servers may be submerged in the dielectric coolant in a liquid phase. As the heat from the servers is absorbed by the dielectric coolant, the temperature of the coolant increases until it changes into a vapor (i.e., boils). The vaporized coolant rises to the upper portion of the tub where it condenses back into a liquid phase and drips back down into the reservoir of liquid coolant.

Regarding the aforementioned cooling methods, the focus of conventional liquid immersive methods was put on the general and coarse results of liquid cooling instead of how the IT device could be cooled more efficiently. One thing that has been usually ignored is the direction of travel of the coolant as it approaches the heat sink. FIG. 1 is a perspective view of an exemplary heat sink designed for air cooling. This heat sink was optimized for maximum thermal performance at a certain direction of air flow, as indicated by the arrow in the drawing, and in general electronic devices like servers and miners in a computing system are designed for the best thermal performance at the same flow direction as that through heat sinks.

By way of educational background, another aspect of the prior art generally useful to be aware of is that there are many different liquid cooling solutions available on the market. The following focuses on current solutions relevant to spray cooling, which is an improved version of conventional immersion cooling technology wherein liquid coolant is sprayed onto heat generating components of a computing system and/or onto heat sinks in contact with the heat generating components. It has been found and published in many articles that the direct spray of liquid coolant has a higher heat rejection capacity under certain conditions when compared to other conventional cooling methods. Some current cooling systems focusing on the liquid spray cooling of computer servers utilize the original heat sinks of heat sources (CPU), which are generally designed for air cooling. The direction of liquid spraying (from top to bottom) is perpendicular to the typical horizontal flow direction of air for cooling in computer servers, refer to FIG. 1. The liquid is pushed out of a spray chamber through the holes onto to the targeted heat sources as a liquid beam. The free liquid heated by heat sources is then collected in the base cabinet and drained/suctioned out of the base cabinet. It is believed that because the vertical streams of the liquid are being sprayed onto horizontally oriented heat sources and heat sinks, it may be difficult to drain the dielectric liquid completely from the components. Any trapped dielectric liquid on the motherboard and components may work as an insulation layer to create potential hotspots within the server. Other current cooling systems utilize redesigned heat sinks made for liquid cooling applications that may be attached to the tops of the heat sources. The horizontal design of some such redesigned heat sinks may allow for the liquid to collect between the fins and act as an insulation layer to hinder the heat rejection. Other redesigned heat sinks are configured to enable liquid to be flushed through the fins of the heat sink and then drained out of the heat sink freely after absorbing the heat from heat sources. The hot liquid leaving the heat sinks is freely drained to the mother board or other components to be collected in the cabinet and suctioned out by a circulation pump. The free liquid on mother board and other components may be difficult to be drained away regarding the horizontal layout of servers and may act as an insulation layer to hinder the heat rejection.

Another type of high heat density equipment that has largely been ignored by existing cooling solutions are cryptocurrency miners. Some miner models have much higher thermal density than computer servers. Although the immersive liquid cooling-tub could cool the miner better than air cooled technology, the need for a larger liquid charging quantity because the miner typically needs to be fully submerged in the liquid and low heat transferring efficiency through the mode of natural convection have restricted the application of liquid cooling-tub technology.

In view of the foregoing, it is clear that these traditional techniques are not perfect and leave room for more optimal approaches.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A is a side perspective view of the liquid cooling cell. FIG. 2B is a partially transparent view of the liquid cooling cell. FIG. 2C is a side perspective view of a coolant circulation system within the liquid cooling cell. FIG. 2D is a side perspective view of a spray cooling mechanism. FIG. 2E is a front view of the spray cooling mechanism, and FIG. 2F is a schematic diagram of the thermal management system;

FIG. 3A is a bottom view, and FIG. 3B is a side view;

FIGS. 4A through 4F illustrate different spray patterns from nozzles that may be used in accordance with embodiments of the present invention. FIG. 4A shows a nozzle with a pneumatic atomization spray pattern, FIG. 4B shows a nozzle with an axial-flow, hollow cone spray pattern. FIG. 4C shows a nozzle with a tangential-flow hollow cone spray pattern. FIG. 4D shows a nozzle with a full cone spray pattern. FIG. 4E shows a nozzle with a solid stream/tank cleaning spray pattern, and FIG. 4F shows a nozzle with a flat fan spray patter;

FIG. 5A is a partially transparent side perspective view of the thermal management system. FIG. 5B is a side perspective view of a coolant circulation system within the thermal management system, and FIG. 5C is a front view of the spray cooling mechanism;

FIG. 6A is a partially transparent side perspective view of the thermal management system. FIG. 6B is a side perspective view of a coolant circulation system within the thermal management system. FIG. 6C is a front view of the spray cooling mechanism, and FIG. 6D is a bottom view of an exemplary sprayer 6011;

FIG. 7A is a partially transparent side perspective view of the thermal management system. FIG. 7B is a side perspective view of a spraying subsystem within the thermal management system. FIG. 7C is a side view of the spraying subsystem, and FIG. 7D is a front view of the spray cooling mechanism; FIG. 8A is a partially transparent side perspective view of the thermal management system. FIG. 8B is a side perspective view of a coolant circulation system within the thermal management system, and FIG. 8C is a bottom view of an exemplary sprayer.

Figure 1:
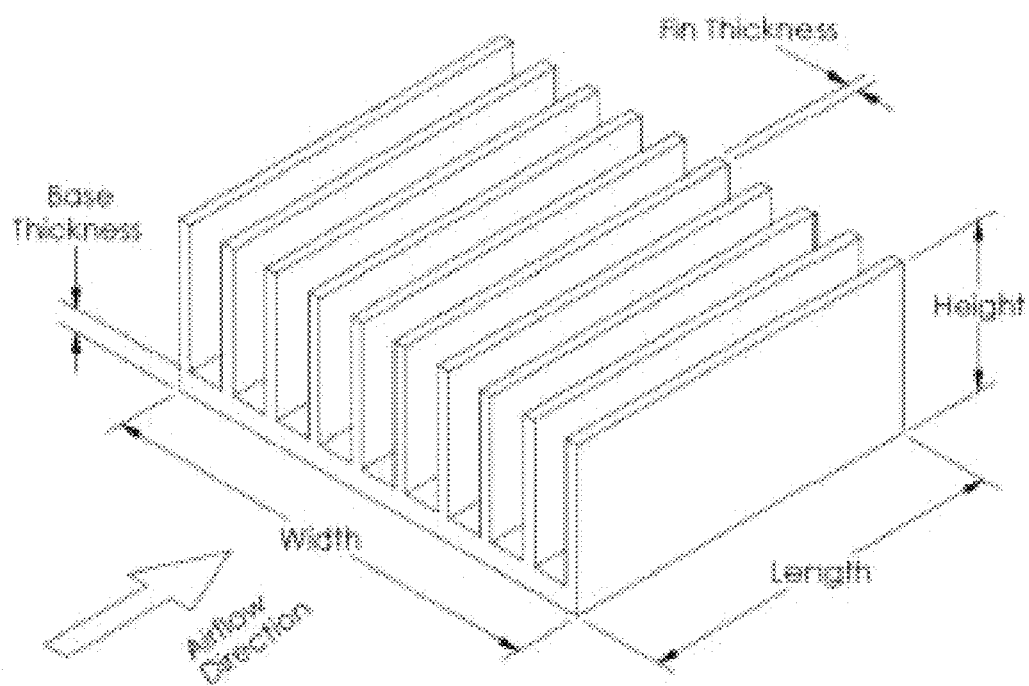
FIG. 1 is a perspective view of an exemplary heat sink designed for air cooling, in accordance with the prior art.

Unless otherwise indicated illustrations in the figures are not necessarily drawn to scale.

DETAILED DESCRIPTION OF SOME EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. For example, it should be appreciated that those skilled in the art will, in light of the teachings of the present invention, recognize a multiplicity of alternate and suitable approaches, depending upon the needs of the particular application, to implement the functionality of any given detail described herein, beyond the particular implementation choices in the following embodiments described and shown. That is, there are modifications and variations of the invention that are too numerous to be listed but that all fit within the scope of the invention. Also, singular words should be read as plural and vice versa and masculine as feminine and vice versa, where appropriate, and alternative embodiments do not necessarily imply that the two are mutually exclusive.

It is to be further understood that the present invention is not limited to the particular methodology, compounds, materials, manufacturing techniques, uses, and applications, described herein, as these may vary. It is also to be understood that the terminology used herein is used for the purpose of describing particular embodiments only, and is not intended to limit the scope of the present invention. It must be noted that as used herein and in the appended claims, the singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described herein are to be understood also to refer to functional equivalents of such structures. Language that may be construed to express approximation should be so understood unless the context clearly dictates otherwise.

All words of approximation as used in the present disclosure and claims should be construed to mean "approximate," rather than "perfect," and may accordingly be employed as a meaningful modifier to any other word, specified parameter, quantity, quality, or concept. Words of approximation, include, yet are not limited to terms such as "substantial", "nearly", "almost", "about", "generally", "largely", "essentially", "closely approximate", etc.

As will be established in some detail below, it is well settled law, as early as 1939, that words of approximation are not indefinite in the claims even when such limits are not defined or specified in the specification.

For example, see Ex parte Mallory, 52 USPQ 297, 297 (Pat. Off. Bd. App. 1941) where the court said "The examiner has held that most of the claims are inaccurate because apparently the laminar film will not be entirely eliminated. The claims specify that the film is "substantially" eliminated and for the intended purpose, it is believed that the slight portion of the film which may remain is negligible. We are of the view, therefore, that the claims may be regarded as sufficiently accurate."

Note that claims need only "reasonably apprise those skilled in the art" as to their scope to satisfy the definiteness requirement. See Energy Absorption Sys., Inc. v. Roadway Safety Servs., Inc., Civ. App. 96-1264, slip op. at 10 (Fed. Cir. Jul. 3, 1997) (unpublished) Hybridtech v. Monoclonal Antibodies, Inc., 802 F.2d 1367, 1385, 231 USPQ 81, 94 (Fed. Cir. 1986), cert. denied, 480 U.S. 947 (1987). In addition, the use of modifiers in the claim, like "generally" and "substantial," does not by itself render the claims indefinite. See Seattle Box Co. v. Industrial Crating & Packing, Inc., 731 F.2d 818, 828-29, 221 USPQ 568, 575-76 (Fed. Cir. 1984).

Moreover, the ordinary and customary meaning of terms like "substantially" includes "reasonably close to: nearly, almost, about", connoting a term of approximation. See In re Frye, Appeal No. 2009-006013, 94 USPQ2d 1072, 1077, 2010 WL 889747 (B.P.A.I. 2010) Depending on its usage, the word "substantially" can denote either language of approximation or language of magnitude. Deering Precision Instruments, L.L.C. v. Vector Distribution Sys., Inc., 347 F.3d 1314, 1323 (Fed. Cir. 2003) (recognizing the "dual ordinary meaning of th[e] term ["substantially"] as connoting a term of approximation or a term of magnitude"). Here, when referring to the "substantially halfway" limitation, the Specification uses the word "approximately" as a substitute for the word "substantially" (Fact 4). (Fact 4). The ordinary meaning of "substantially halfway" is thus reasonably close to or nearly at the midpoint between the forwardmost point of the upper or outsole and the rearwardmost point of the upper or outsole.

Similarly, the term 'substantially' is well recognized in case law to have the dual ordinary meaning of connoting a term of approximation or a term of magnitude. See Dana Corp. v. American Axle & Manufacturing, Inc., Civ. App. 04-1116, 2004 U.S. App. LEXIS 18265, *13-14 (Fed. Cir. Aug. 27, 2004) (unpublished). The term "substantially" is commonly used by claim drafters to indicate approximation. See Cordis Corp. v. Medtronic AVE Inc., 339 F.3d 1352, 1360 (Fed. Cir. 2003) ("The patents do not set out any numerical standard by which to determine whether the thickness of the wall surface is 'substantially uniform.' The term 'substantially,' as used in this context, denotes approximation. Thus, the walls must be of largely or approximately uniform thickness."); see also Deering Precision Instruments, LLC v. Vector Distribution Sys., Inc., 347 F.3d 1314, 1322 (Fed. Cir. 2003); Epcon Gas Sys., Inc. v. Bauer Compressors, Inc., 279 F.3d 1022, 1031 (Fed. Cir. 2002). We find that the term "substantially" was used in just such a manner in the claims of the patents-in-suit: "substantially uniform wall thickness" denotes a wall thickness with approximate uniformity.

It should also be noted that such words of approximation as contemplated in the foregoing clearly limits the scope of claims such as saying 'generally parallel' such that the adverb 'generally' does not broaden the meaning of parallel. Accordingly, it is well settled that such words of approximation as contemplated in the foregoing (e.g., like the phrase 'generally parallel') envisions some amount of deviation from perfection (e.g., not exactly parallel), and that such words of approximation as contemplated in the foregoing are descriptive terms commonly used in patent claims to avoid a strict numerical boundary to the specified parameter. To the extent that the plain language of the claims relying on such words of approximation as contemplated in the foregoing are clear and uncontradicted by anything in the written description herein or the figures thereof, it is improper to rely upon the present written description, the figures, or the prosecution history to add limitations to any of the claim of the present invention with respect to such words of approximation as contemplated in the foregoing. That is, under such circumstances, relying on the written description and prosecution history to reject the ordinary and customary meanings of the words themselves is impermissible. See, for example, Liquid Dynamics Corp. v. Vaughan Co., 355 F.3d 1361, 69 USPQ2d 1595, 1600-01 (Fed. Cir. 2004). The plain language of phrase 2 requires a "substantial helical flow." The term "substantial" is a meaningful modifier implying "approximate," rather than "perfect." In Cordis Corp. v. Medtronic AVE, Inc., 339 F.3d 1352, 1361 (Fed. Cir. 2003), the district court imposed a precise numeric constraint on the term "substantially uniform thickness." We noted that the proper interpretation of this term was "of largely or approximately uniform thickness" unless something in the prosecution history imposed the "clear and unmistakable disclaimer" needed for narrowing beyond this simple-language interpretation. Id. In Anchor Wall Systems v. Rockwood Retaining Walls, Inc., 340 F.3d 1298, 1311 (Fed. Cir. 2003)" Id. at 1311. Similarly, the plain language of claim 1 requires neither a perfectly helical flow nor a flow that returns precisely to the center after one rotation (a limitation that arises only as a logical consequence of requiring a perfectly helical flow).

The reader should appreciate that case law generally recognizes a dual ordinary meaning of such words of approximation, as contemplated in the foregoing, as connoting a term of approximation or a term of magnitude; e.g., see Deering Precision Instruments, L.L.C. v. Vector Distrib. Sys., Inc., 347 F.3d 1314, 68 USPQ2d 1716, 1721 (Fed. Cir. 2003), cert. denied, 124 S. Ct. 1426 (2004) where the court was asked to construe the meaning of the term "substantially" in a patent claim. Also see Epcon, 279 F.3d at 1031 ("The phrase 'substantially constant' denotes language of approximation, while the phrase 'substantially below' signifies language of magnitude, i.e., not insubstantial."). Also, see, e.g., Epcon Gas Sys., Inc. v. Bauer Compressors, Inc., 279 F.3d 1022 (Fed. Cir. 2002) (construing the terms "substantially constant" and "substantially below"); Zodiac Pool Care, Inc. v. Hoffinger Indus., Inc., 206 F.3d 1408 (Fed. Cir. 2000) (construing the term "substantially inward"); York Prods., Inc. v. Cent. Tractor Farm & Family Ctr., 99 F.3d 1568 (Fed. Cir. 1996) (construing the term "substantially the entire height thereof"); Tex. Instruments Inc. v. Cypress Semiconductor Corp., 90 F.3d 1558 (Fed. Cir. 1996) (construing the term "substantially in the common plane"). In conducting their analysis, the court instructed to begin with the ordinary meaning of the claim terms to one of ordinary skill in the art. Prima Tek, 318 F.3d at 1148. Reference to dictionaries and our cases indicates that the term "substantially" has numerous ordinary meanings. As the district court stated, "substantially" can mean "significantly" or "considerably." The term "substantially" can also mean "largely" or "essentially." Webster's New 20th Century Dictionary 1817 (1983).

Words of approximation, as contemplated in the foregoing, may also be used in phrases establishing approximate ranges or limits, where the end points are inclusive and approximate, not perfect; e.g., see AK Steel Corp. v. Sollac, 344 F.3d 1234, 68 USPQ2d 1280, 1285 (Fed. Cir. 2003) where it where the court said [W]e conclude that the ordinary meaning of the phrase "up to about 10%" includes the "about 10%" endpoint. As pointed out by AK Steel, when an object of the preposition "up to" is nonnumeric, the most natural meaning is to exclude the object (e.g., painting the wall up to the door). On the other hand, as pointed out by Sollac, when the object is a numerical limit, the normal meaning is to include that upper numerical limit (e.g., counting up to ten, seating capacity for up to seven passengers). Because we have here a numerical limit—"about 10%"—the ordinary meaning is that that endpoint is included.

In the present specification and claims, a goal of employment of such words of approximation, as contemplated in the foregoing, is to avoid a strict numerical boundary to the modified specified parameter, as sanctioned by Pall Corp. v. Micron Separations, Inc., 66 F.3d 1211, 1217, 36 USPQ2d 1225, 1229 (Fed. Cir. 1995) where it states "It is well established that when the term "substantially" serves reasonably to describe the subject matter so that its scope would be understood by persons in the field of the invention, and to distinguish the claimed subject matter from the prior art, it is not indefinite." Likewise see Verve LLC v. Crane Cams Inc., 311 F.3d 1116, 65 USPQ2d 1051, 1054 (Fed. Cir. 2002). Expressions such as "substantially" are used in patent documents when warranted by the nature of the invention, in order to accommodate the minor variations that may be appropriate to secure the invention. Such usage may well satisfy the charge to "particularly point out and distinctly claim" the invention, 35 U.S.C. § 112, and indeed may be necessary in order to provide the inventor with the benefit of his invention. In Andrew Corp. v. Gabriel Elecs. Inc., 847 F.2d 819, 821-22, 6 USPQ2d 2010, 2013 (Fed. Cir. 1988) the court explained that usages such as "substantially equal" and "closely approximate" may serve to describe the invention with precision appropriate to the technology and without intruding on the prior art. The court again explained in Ecolab Inc. v. Envirochem, Inc., 264 F.3d 1358, 1367, 60 USPQ2d 1173, 1179 (Fed. Cir. 2001) that "like the term 'about,' the term 'substantially' is a descriptive term commonly used in patent claims to 'avoid a strict numerical boundary to the specified parameter, see Ecolab Inc. v. Envirochem Inc., 264 F.3d 1358, 60 USPQ2d 1173, 1179 (Fed. Cir. 2001) where the court found that the use of the term "substantially" to modify the term "uniform" does not render this phrase so unclear such that there is no means by which to ascertain the claim scope.

Similarly, other courts have noted that like the term "about," the term "substantially" is a descriptive term commonly used in patent claims to "avoid a strict numerical boundary to the specified parameter."; e.g., see Pall Corp. v. Micron Seps., 66 F.3d 1211, 1217, 36 USPQ2d 1225, 1229 (Fed. Cir. 1995); see, e.g., Andrew Corp. v. Gabriel Elecs. Inc., 847 F.2d 819, 821-22, 6 USPQ2d 2010, 2013 (Fed. Cir. 1988) (noting that terms such as "approach each other," "close to," "substantially equal," and "closely approximate" are ubiquitously used in patent claims and that such usages, when serving reasonably to describe the claimed subject matter to those of skill in the field of the invention, and to distinguish the claimed subject matter from the prior art, have been accepted in patent examination and upheld by the courts). In this case, "substantially" avoids the strict 100% nonuniformity boundary.

Indeed, the foregoing sanctioning of such words of approximation, as contemplated in the foregoing, has been established as early as 1939, see Ex parte Mallory, 52 USPQ 297, 297 (Pat. Off. Bd. App. 1941) where, for example, the court said "the claims specify that the film is "substantially" eliminated and for the intended purpose, it is believed that the slight portion of the film which may remain is negligible. We are of the view, therefore, that the claims may be regarded as sufficiently accurate." Similarly, In re Hutchison, 104 F.2d 829, 42 USPQ 90, 93 (C.C.P.A. 1939) the court said "It is realized that "substantial distance" is a relative and somewhat indefinite term, or phrase, but terms and phrases of this character are not uncommon in patents in cases where, according to the art involved, the meaning can be determined with reasonable clearness."

Hence, for at least the forgoing reason, Applicants submit that it is improper for any examiner to hold as indefinite any claims of the present patent that employ any words of approximation.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures. The present invention will be described in detail below with reference to embodiments thereof as illustrated in the accompanying drawings.

References to a "device," an "apparatus," a "system," etc., in the preamble of a claim should be construed broadly to mean "any structure meeting the claim terms" exempt for any specific structure(s)/type(s) that has/(have) been explicitly disavowed or excluded or admitted/implied as prior art in the present specification or incapable of enabling an object/aspect/goal of the invention. Furthermore, where the present specification discloses an object, aspect, function, goal, result, or advantage of the invention that a specific prior art structure and/or method step is similarly capable of performing yet in a very different way, the present invention disclosure is intended to and shall also implicitly include and cover additional corresponding alternative embodiments that are otherwise identical to that explicitly disclosed except that they exclude such prior art structure(s)/step(s), and shall accordingly be deemed as providing sufficient disclosure to support a corresponding negative limitation in a claim claiming such alternative embodiment(s), which exclude such very different prior art structure(s)/step(s) way(s).

From reading the present disclosure, other variations and modifications will be apparent to persons skilled in the art. Such variations and modifications may involve equivalent and other features which are already known in the art, and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any Claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The Applicants hereby give notice that new Claims may be formulated to such features and/or combinations of such features during the prosecution of the present Application or of any further Application derived therefrom.

References to "one embodiment," "an embodiment," "example embodiment," "various embodiments," "some embodiments," "embodiments of the invention," etc., may indicate that the embodiment(s) of the invention so described may include a particular feature, structure, or characteristic, but not every possible embodiment of the invention necessarily includes the particular feature, structure, or characteristic. Further, repeated use of the phrase "in one embodiment," or "in an exemplary embodiment," "an embodiment," do not necessarily refer to the same embodiment, although they may. Moreover, any use of phrases like "embodiments" in connection with "the invention" are never meant to characterize that all embodiments of the invention must include the particular feature, structure, or characteristic, and should instead be understood to mean "at least some embodiments of the invention" include the stated particular feature, structure, or characteristic.

References to "user", or any similar term, as used herein, may mean a human or non-human user thereof. Moreover, "user", or any similar term, as used herein, unless expressly stipulated otherwise, is contemplated to mean users at any stage of the usage process, to include, without limitation, direct user(s), intermediate user(s), indirect user(s), and end user(s). The meaning of "user", or any similar term, as used herein, should not be otherwise inferred, or induced by any pattern(s) of description, embodiments, examples, or referenced prior-art that may (or may not) be provided in the present patent.

References to "end user", or any similar term, as used herein, is generally intended to mean late-stage user(s) as opposed to early-stage user(s). Hence, it is contemplated that there may be a multiplicity of different types of "end user" near the end stage of the usage process. Where applicable, especially with respect to distribution channels of embodiments of the invention comprising consumed retail products/services thereof (as opposed to sellers/vendors or Original Equipment Manufacturers), examples of an "end user" may include, without limitation, a "consumer", "buyer", "customer", "purchaser", "shopper", "enjoyer", "viewer", or individual person or non-human thing benefiting in any way, directly or indirectly, from use of. or interaction, with some aspect of the present invention.

In some situations, some embodiments of the present invention may provide beneficial usage to more than one stage or type of usage in the foregoing usage process. In such cases where multiple embodiments targeting various stages of the usage process are described, references to "end user", or any similar term, as used therein, are generally intended to not include the user that is the furthest removed, in the foregoing usage process, from the final user therein of an embodiment of the present invention.

Where applicable, especially with respect to retail distribution channels of embodiments of the invention, intermediate user(s) may include, without limitation, any individual person or non-human thing benefiting in any way, directly or indirectly, from use of, or interaction with, some aspect of the present invention with respect to selling, vending, Original Equipment Manufacturing, marketing, merchandising, distributing, service providing, and the like thereof.

References to "person", "individual", "human", "a party", "animal", "creature", or any similar term, as used herein, even if the context or particular embodiment implies living user, maker, or participant, it should be understood that such characterizations are sole by way of example, and not limitation, in that it is contemplated that any such usage, making, or participation by a living entity in connection with making, using, and/or participating, in any way, with embodiments of the present invention may be substituted by such similar performed by a suitably configured non-living entity, to include, without limitation, automated machines, robots, humanoids, computational systems, information processing systems, artificially intelligent systems, and the like. It is further contemplated that those skilled in the art will readily recognize the practical situations where such living makers, users, and/or participants with embodiments of the present invention may be in whole, or in part, replaced with such non-living makers, users, and/or participants with embodiments of the present invention. Likewise, when those skilled in the art identify such practical situations where such living makers, users, and/or participants with embodiments of the present invention may be in whole, or in part, replaced with such non-living makers, it will be readily apparent in light of the teachings of the present invention how to adapt the described embodiments to be suitable for such non-living makers, users, and/or participants with embodiments of the present invention. Thus, the invention is thus to also cover all such modifications, equivalents, and alternatives falling within the spirit and scope of such adaptations and modifications, at least in part, for such non-living entities.

Headings provided herein are for convenience and are not to be taken as limiting the disclosure in any way.

The enumerated listing of items does not imply that any or all of the items are mutually exclusive, unless expressly specified otherwise.

It is understood that the use of specific component, device and/or parameter names are for example only and not meant to imply any limitations on the invention. The invention may thus be implemented with different nomenclature/terminology utilized to describe the mechanisms/units/structures/components/devices/parameters herein, without limitation. Each term utilized herein is to be given its broadest interpretation given the context in which that term is utilized.

Terminology. The following paragraphs provide definitions and/or context for terms found in this disclosure (including the appended claims):

"Comprising" And "contain" and variations of them—Such terms are open-ended and mean "including but not limited to". When employed in the appended claims, this term does not foreclose additional structure or steps. Consider a claim that recites: "A memory controller comprising a system cache . . . " Such a claim does not foreclose the memory controller from including additional components (e.g., a memory channel unit, a switch).

"Configured To." Various units, circuits, or other components may be described or claimed as "configured to" perform a task or tasks. In such contexts, "configured to" or "operable for" is used to connote structure by indicating that the mechanisms/units/circuits/components include structure (e.g., circuitry and/or mechanisms) that performs the task or tasks during operation. As such, the mechanisms/unit/circuit/component can be said to be configured to (or be operable) for perform(ing) the task even when the specified mechanisms/unit/circuit/component is not currently operational (e.g., is not on). The mechanisms/units/circuits/components used with the "configured to" or "operable for" language include hardware—for example, mechanisms, structures, electronics, circuits, memory storing program instructions executable to implement the operation, etc. Reciting that a mechanism/unit/circuit/component is "configured to" or "operable for" perform(ing) one or more tasks is expressly intended not to invoke 35 U.S.C. sctn.112, sixth paragraph, for that mechanism/unit/circuit/component. "Configured to" may also include adapting a manufacturing process to fabricate devices or components that are adapted to implement or perform one or more tasks.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

The terms "a", "an" and "the" mean "one or more", unless expressly specified otherwise.

All terms of exemplary language (e.g., including, without limitation, "such as", "like", "for example", "for instance", "similar to", etc.) are not exclusive of any other, potentially, unrelated, types of examples; thus, implicitly mean "by way of example, and not limitation . . . ", unless expressly specified otherwise.

Unless otherwise indicated, all numbers expressing conditions, concentrations, dimensions, and so forth used in the specification and claims are to be understood as being modified in all instances by the term "about." Accordingly, unless indicated to the contrary, the numerical parameters set forth in the following specification and attached claims are approximations that may vary depending at least upon a specific analytical technique.

The term "comprising," which is synonymous with "including," "containing," or "characterized by" is inclusive or open-ended and does not exclude additional, unrecited elements or method steps. "Comprising" is a term of art used in claim language which means that the named claim elements are essential, but other claim elements may be added and still form a construct within the scope of the claim.

As used herein, the phase "consisting of" excludes any element, step, or ingredient not specified in the claim. When the phrase "consists of" (or variations thereof) appears in a clause of the body of a claim, rather than immediately following the preamble, it limits only the element set forth in that clause; other elements are not excluded from the claim as a whole. As used herein, the phrase "consisting essentially of" and "consisting of" limits the scope of a claim to the specified elements or method steps, plus those that do not materially affect the basis and novel characteristic(s) of the claimed subject matter (see Norian Corp. v Stryker Corp., 363 F.3d 1321, 1331-32, 70 USPQ2d 1508, Fed. Cir. 2004). Moreover, for any claim of the present invention which claims an embodiment "consisting essentially of" or "consisting of" a certain set of elements of any herein described embodiment it shall be understood as obvious by those skilled in the art that the present invention also covers all possible varying scope variants of any described embodiment(s) that are each exclusively (i.e., "consisting essentially of") functional subsets or functional combination thereof such that each of these plurality of exclusive varying scope variants each consists essentially of any functional subset(s) and/or functional combination(s) of any set of elements of any described embodiment(s) to the exclusion of any others not set forth therein. That is, it is contemplated that it will be obvious to those skilled how to create a multiplicity of alternate embodiments of the present invention that simply consisting essentially of a certain functional combination of elements of any described embodiment(s) to the exclusion of any others not set forth therein, and the invention thus covers all such exclusive embodiments as if they were each described herein.

With respect to the terms "comprising," "consisting of," and "consisting essentially of," where one of these three terms is used herein, the disclosed and claimed subject matter may include the use of either of the other two terms. Thus, in some embodiments not otherwise explicitly recited, any instance of "comprising" may be replaced by "consisting of" or, alternatively, by "consisting essentially of", and thus, for the purposes of claim support and construction for "consisting of" format claims, such replacements operate to create yet other alternative embodiments "consisting essentially of" only the elements recited in the original "comprising" embodiment to the exclusion of all other elements.

Moreover, any claim limitation phrased in functional limitation terms covered by 35 USC § 112(6) (post AIA 112(f)) which has a preamble invoking the closed terms "consisting of," or "consisting essentially of," should be understood to mean that the corresponding structure(s) disclosed herein define the exact metes and bounds of what the so claimed invention embodiment(s) consists of, or consisting essentially of, to the exclusion of any other elements which do not materially affect the intended purpose of the so claimed embodiment(s). Furthermore, any statement(s), identification(s), or reference(s) to a structure(s) and/or element(s) that corresponds to and/or supports a claim limitation(s) phrased in functional limitation terms covered by 35 USC § 112(6) (post AIA 112(f)) should be understood to be identified by way of example and not limitation, and as such, should not be interpreted to mean that such recited structure and/or element is/are the only structure(s) and/or element(s) disclosed in this patent application that corresponds to and/or supports such claim limitations phrased in functional limitation terms. This claims interpretation intention also applies to any such subsequent statements made by Applicant during prosecution.

Devices or system modules that are in at least general communication with each other need not be in continuous communication with each other, unless expressly specified otherwise. In addition, devices or system modules that are in at least general communication with each other may communicate directly or indirectly through one or more intermediaries. Moreover, it is understood that any system components described or named in any embodiment or claimed herein may be grouped or sub-grouped (and accordingly implicitly renamed) in any combination or sub-combination as those skilled in the art can imagine as suitable for the particular application, and still be within the scope and spirit of the claimed embodiments of the present invention. For an example of what this means, if the invention was a controller of a motor and a valve and the embodiments and claims articulated those components as being separately grouped and connected, applying the foregoing would mean that such an invention and claims would also implicitly cover the valve being grouped inside the motor and the controller being a remote controller with no direct physical connection to the motor or internalized valve, as such the claimed invention is contemplated to cover all ways of grouping and/or adding of intermediate components or systems that still substantially achieve the intended result of the invention.

A description of an embodiment with several components in communication with each other does not imply that all such components are required. On the contrary a variety of optional components are described to illustrate the wide variety of possible embodiments of the present invention.

As is well known to those skilled in the art many careful considerations and compromises typically must be made when designing for the optimal manufacture of a commercial implementation any system, and in particular, the embodiments of the present invention. A commercial implementation in accordance with the spirit and teachings of the present invention may configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still cooperate or interact with each other.

It is to be understood that any exact measurements/dimensions or particular construction materials indicated herein are solely provided as examples of suitable configurations and are not intended to be limiting in any way. Depending on the needs of the particular application, those skilled in the art will readily recognize, in light of the following teachings, a multiplicity of suitable alternative implementation details.

Embodiments of the present invention disclose cooling systems for electronic devices that incorporate the spraying of liquid coolant along the longitudinal direction of heat sink fins. A preferred embodiment may provide a thermal management solution to a certain type of high heat density electrical devices such as cyber currency miners. It is contemplated that some embodiments may be configured to provide thermal management to other types of high heat density devices and systems such as, but not limited to, computer servers, GPUs, high-density data centers, cryptocurrency miners, cryptocurrency mining racks and farms, insulated-gate bipolar transistors (IGBT) and relevant inverters, switchers, optical devices like laser and LED generators, other types of lazer systems, etc. Devices and systems that may especially benefit from the thermal management provided by embodiments of the present invention may have common characteristics such as, but not limited to, multi-layer motherboards in chassis, a large number of chips/heat sources on each motherboard, limited distance between motherboards, motherboards that are mounted vertically (i.e., perpendicular to the horizon), coolant (e.g., air) flowing through the gaps between motherboards, limited blockage from other components like the hard drive box, frame and other boards, strict requirements of device cleanness and reliability, free cooling available only, heat recovery from data center, etc. The components and their layout on each motherboard are the same or different. The heat load of components and processors on each motherboard are the same or different. The geometrical profiles of the components or attached motherboards are the same or different. It is contemplated that embodiments of the present invention may be implemented to cool different computer server models with different heat loads in one enclosure by adjusting the spray pattern (position of spray holes and size of spray holes). This feature can be helpful to realize the modular/standard design of these cooling systems where the sprayers can be made as customized components are. Compared with conventional approaches where all objectives are physically immerged in a big tank, the objectives to be cooled by embodiments of the present invention can be different because the coolant is supplied by amount and position as it is needed, and the cooling of different objectives are not affected by each other.

Figure 2A:
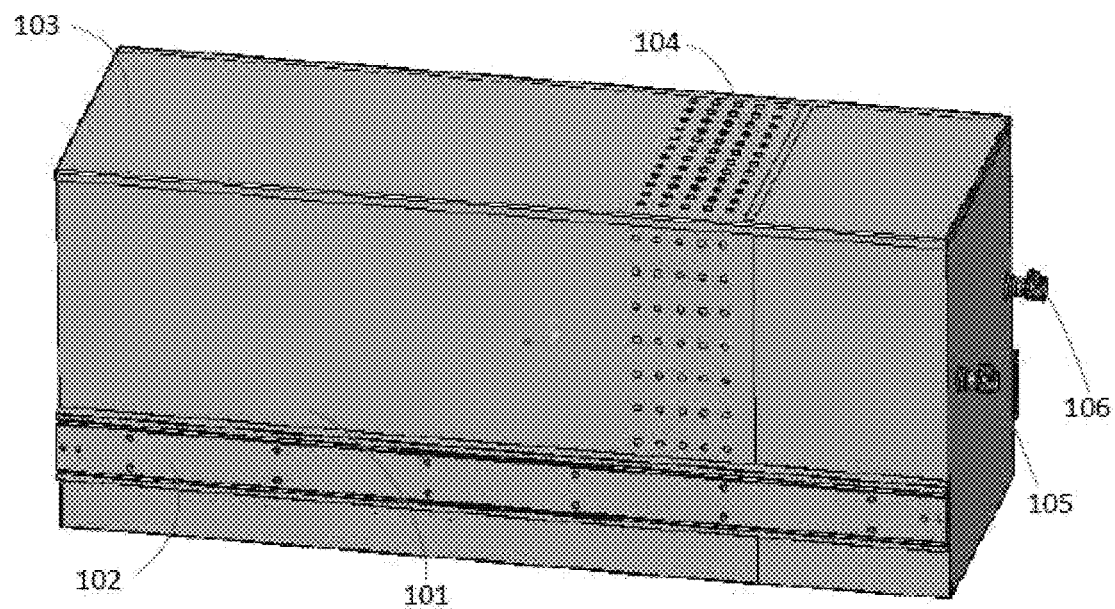
FIGS. 2A through 2F illustrate an exemplary thermal management system comprising a liquid cooling cell configured to cool cryptocurrency miners, in accordance with the embodiment of the present invention.
Figure 2B:
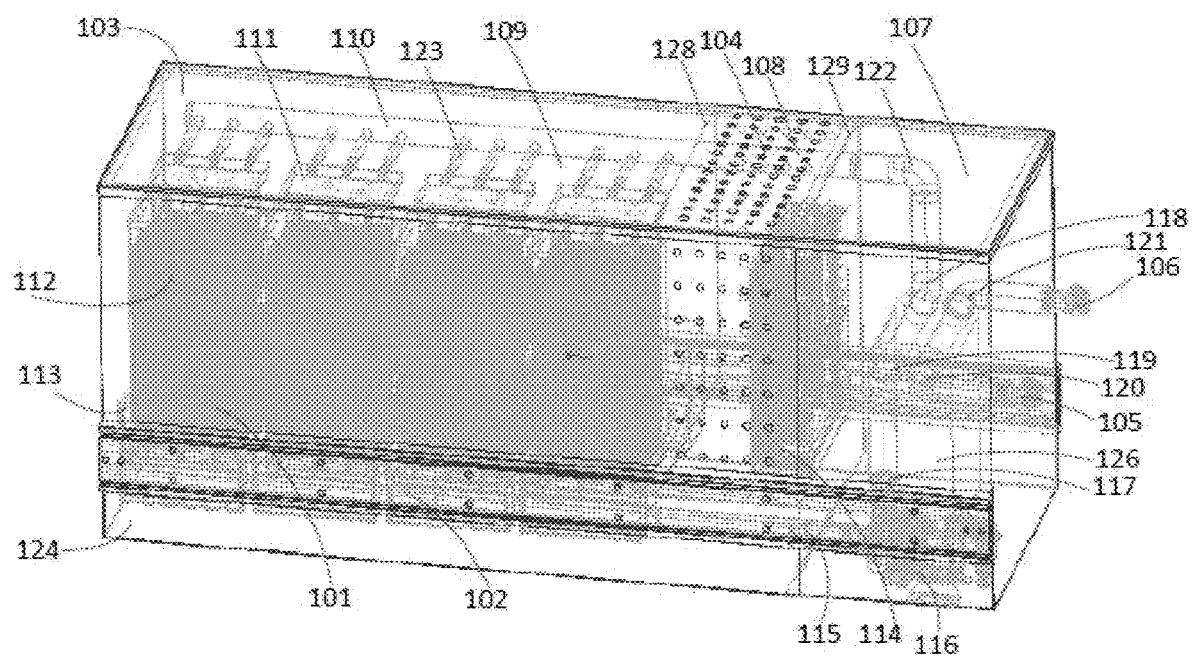
Figure 2C:
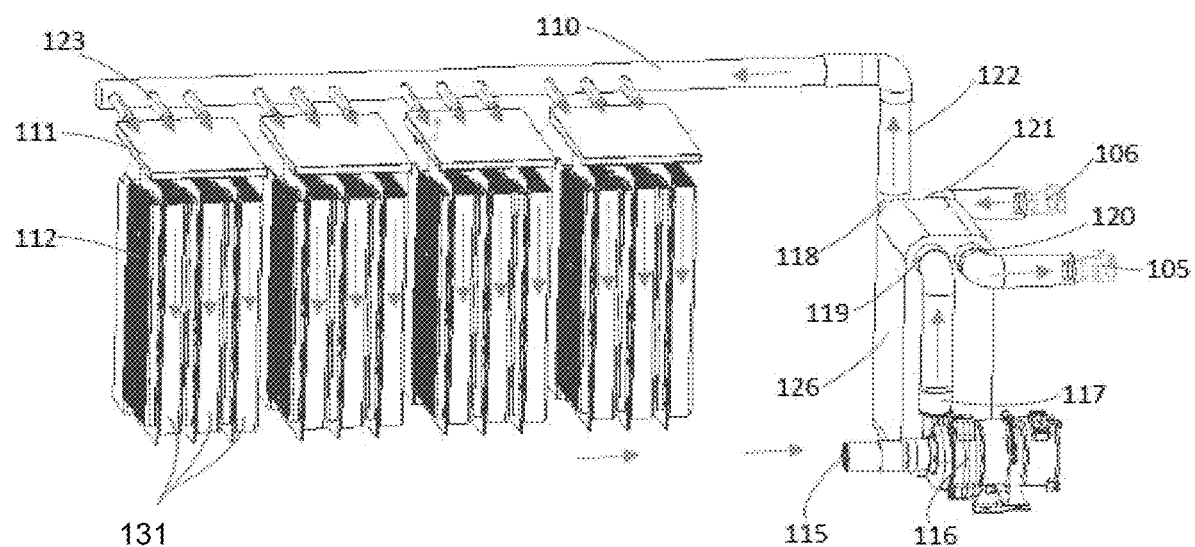
Figure 2D:
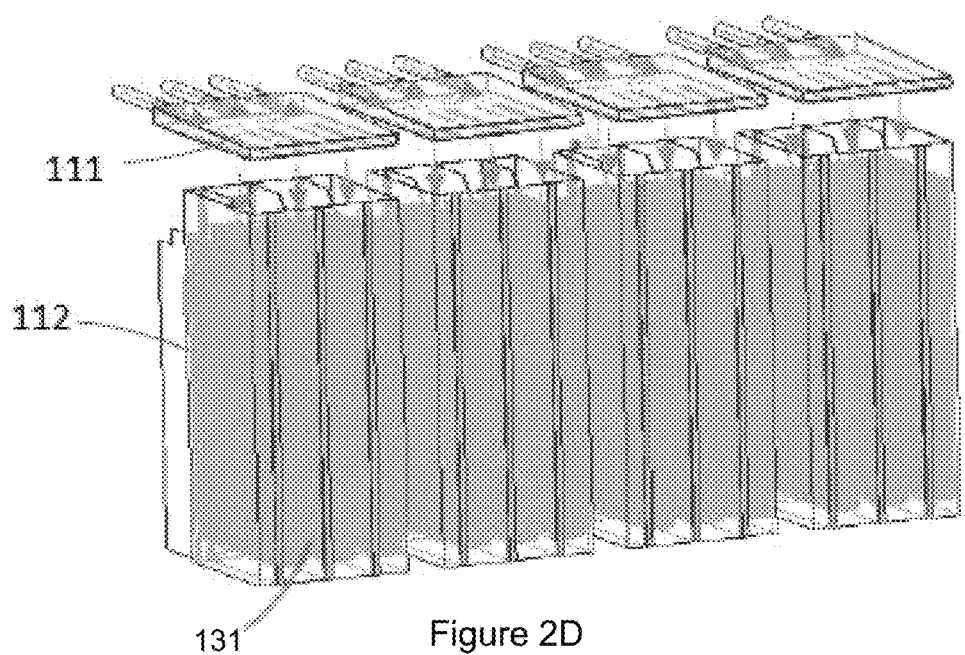
Figure 2E:
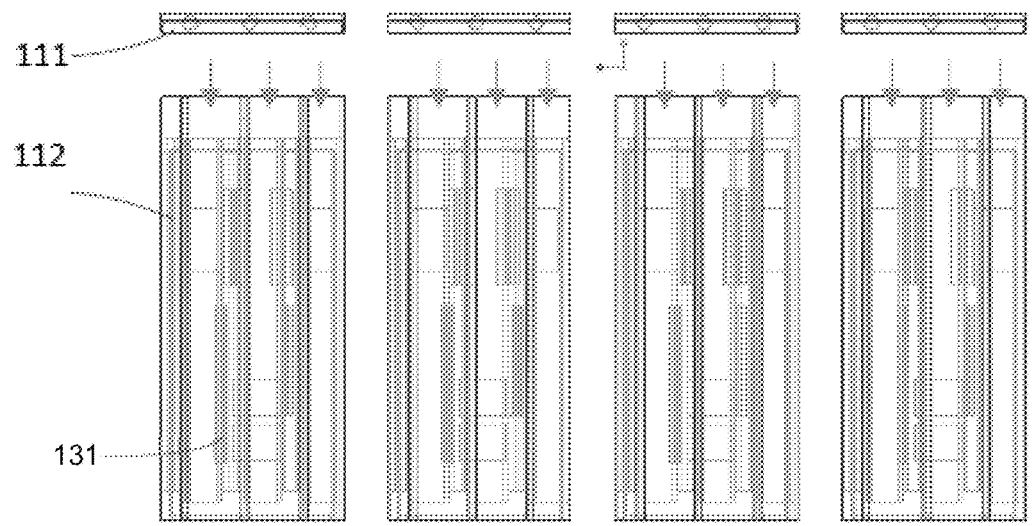
Figure 2F:
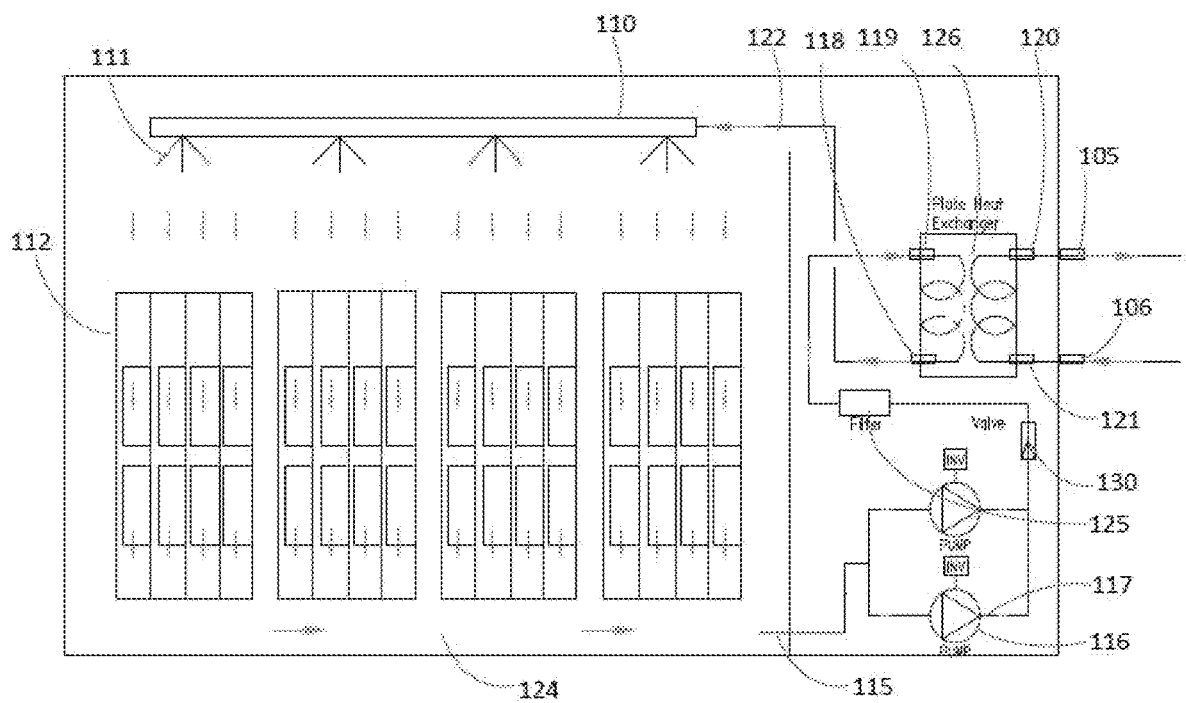

FIGS. 2A through 2F illustrate an exemplary thermal management system comprising a liquid cooling cell configured to cool cryptocurrency miners 112, in accordance with the embodiment of the present invention. FIG. 2A is a side perspective view of the liquid cooling cell. FIG. 2B is a partially transparent view of the liquid cooling cell. FIG. 2C is a side perspective view of a coolant circulation system within the liquid cooling cell. FIG. 2D is a side perspective view of a spray cooling mechanism. FIG. 2E is a front view of the spray cooling mechanism, and FIG. 2F is a schematic diagram of the thermal management system. In the present embodiment a housing 101 and a cover 103 form a chamber separated into three sections, a heat exchanger/pump section 107, an electrical power section 108 and a spray cooling section 109. Each section is isolated from the other sections. It is contemplated that in alternate embodiments the chamber may comprise more or fewer sections. For example, without limitation, the embodiment illustrated in FIGS. 8A-8C discloses a chamber separated into two sections, a heat exchanger section, and a cooling section. In the present embodiment, housing 101, cover 103, and dividers 128 and 129 that separate the chamber into the separate sections, may be made of various materials such as, but not limited to stainless steel, carbon steel sheet metal, other types of sheet metal, plastics that are suitable for use with dielectric oil, resin, fiber glass, etc. Sliding rails 102 may be disposed on the outer surface of housing 101. A pair of sliding rails 102 can provide the possibility to install housing 101 onto a frame so that housing 101 can be slid in and out of the frame. This allows for multiple housings 101 to be stacked in the frame vertically, to achieve much higher space utilization efficiency. Meanwhile, housing 101 can be pulled out of the frame easily with the help of a pair of sliding rails 102. In the present embodiment a coolant supply header 110, sprayers 111, miners 112, a supporting frame 113, a pump suction port 115, spray coolant sub supply lines 123, and a reservoir 124 are included in spray cooling section 109. In typical use of the liquid cooling cell, coolant liquid from coolant supply header 110 flows into spray coolant sub supply lines 123, then to sprayers 111, and then may be pushed through spray holes 127. The cold coolant liquid from the spray holes 127 may be sprayed onto and into the miners 112 below in a specified pattern to carry heat away from miners 112. The heated coolant liquid may flow down the miners 112 and other components within the spray cooling section to be collected in a reservoir 124 under the miners 112.

The spray cooling section 109 may hold more than one miner 112, relevant sprayer 111 and other components including, but not limited to, supporting frame 113 and spray coolant sub supply lines 123. The quantity of miners 112 that may be contained in the spray cooling section 109 typically depends on the total heat capacity of miners 112. The number of miners may depend on dimensions, heat load, geometrical profile and permitted space for the design. It is a tradeoff of various design factors, particularly between cost and reliability. For example, the cost of a bigger housing per miner would generally be lower than that of a smaller housing per miner. However, one may expect that the bigger housing containing more miners would generally have lower reliability than that of a smaller housing. Another potential disadvantage of a larger housing may be that the larger weight may make it difficult to find a suitable heavy-duty slide rail at a reasonable cost. Thus, a system designer may take these factors into consideration on a particular application to design a suitable system with an appropriate number of miners for the system's specific parameters. In the present embodiment, multiple miners 112 and relevant components share the common reservoir 124, which may collect the heated coolant liquid dripped out of miners 112. The reservoir 124 may be connected to the pump suction port 115 which connects to a circulation pump 116 that may act to pump the heated coolant liquid from the reservoir 124 and into a heat exchanger 126 to re-cool the liquid before being recirculated to the sprayers 601. The volume of reservoir 124 may be designed to be as small as possible based on factors such as, without limitation, the pumping capacity of a circulation pump 116, the amount of liquid coolant in the system, the overall size of the cooling cell, etc.

The chamber formed by the spray cooling section 109 and cover 103 may preferably be airtight to help prevent the loss of coolant liquid by liquid evaporation or droplet drift. The sprayers 111 may be located above miners 112 to typically allow for the coolant liquid to be sprayed downward at a straight angle. The coolant liquid coming from sprayers 111 approaches fins 131 of heat sinks, which are in contact with miners 112 and vertically positioned, at a certain speed, wets the surface of fins 131, flushes the surfaces of fins 131 from top to bottom longitudinally, and drips down into the reservoir 124. During this flow process, spray momentum and gravity work together to increase the forced convective heat transfer coefficient when compared to the natural convective heat transfer coefficient in a liquid immersive tub solution. The coolant supply header 110 may be connected to one or more spray coolant sub supply lines 123 for each sprayer 111. The spray coolant sub supply lines 123 could be made using flexible tubes, which may enable the sprayers 111 to be pushed upward or to the side to allow access to the miners 112, for example, without limitation to remove the miners 112 for service purposes. In alternate embodiments the spray coolant sub supply lines may be made of a more rigid material. In the present embodiment, the miners 112 may be seated on the supporting frame 113, and the supporting frame 113 may comprise holes to allow the coolant liquid to pass through and into the reservoir 124. The coolant liquid could be virtually any type of single-phase dielectric fluids such as, but not limited to, mineral oil, natural/synthetic ester oil, silicone oil, or Fluorinert fluids.

The electrical power section 108 may be formed by divider 128, divider 129, housing 101 and cover 103. The electrical power section 108 is beside the spray cooling section 109. In typical use of the present embodiment, the original miner power source modules 114 may be removed from the miners 112 to be put in the electrical power section 108. The cooling medium in the electrical power section 108 is air, which may be driven by fans in the power source modules 114 through ventilation holes 104. It is believed that the system may benefit from separating the original power source 114 from the miners 112 because of discrepancy between the maximum working temperature of the power sources 114 (i.e., max. 40 degree C. as a typical application) and mining chips in miners 112 (i.e., max. 80 degree C. as a typical application). The maximum coolant temperature is typically restricted by the smaller value of working temperature for the power sources and miner chips, which is 40 degree C. in a typical application of a power source. In addition, heat generation power from miner chips typically consumes around 90% of the total input power and the power source typically consumes 10% of the total input power in normal applications. Therefore, higher heat recovery temperature and more recovery power may be achieved by cooling the power sources and miner chips separately. Besides the higher potential of heat recovery, the present embodiment may provide the flexibility of a special application in Cryptocurrency mining, overclocking, where the miners are run at higher clock speeds than originally intended. An extra power source is normally required to overclock the chips because chips running at higher frequencies generally consume more electrical power. The electrical power section 108 could provide extra space for this purpose in some embodiments. The volume of electrical power section 108 typically depends on the size of power sources.

In the present embodiment, the heat exchanger/pump section 107 is located beside the electrical power section 108, which may be formed by divider 129, housing 101 and cover 103. The internal volume of the heat exchanger/pump section 107 may hold pump suction port 115, circulation pump 116, a pump discharging port 117, a spraying coolant heat exchanger outlet 118, a spraying coolant heat exchanger inlet 119, a coolant heat exchanger outlet 120, a coolant heat exchanger inlet 121, a spraying coolant supply line 122, a filter 125, and heat exchanger 126. The circulation pump 116 could be virtually any type of pump that is suitable to meet the required flow and header requirements for the system such as, but not limited to, a centrifugal pump or a positive displacement pump. The type of pump used may depend on factors such as the hydraulic characteristics of the circulation system, reliability requirements, cost, space, installation, services, etc. A positive displacement (PD) pump moves a fluid by repeatedly enclosing a fixed volume of fluid and moving the fluid mechanically through the system. The pumping action is cyclic and can be driven by pistons, screws, gears, rollers, diaphragms, vanes, etc. Centrifugal pumps are used to transport fluids by the conversion of rotational kinetic energy to the hydrodynamic energy of the fluid flow. The heated coolant liquid from reservoir 124 may be suctioned into the pump suction port 115, which is located under the electrical power section 108, and connected with spray cooling section 109. Circulation pump 116 may be mounted at the bottom of housing 101 to pump the coolant liquid out through pump discharging port 117. The coolant liquid exiting the pump discharging port 117 is pumped into the spraying coolant heat exchanger inlet 119 as a first fluid in the heat exchanger 126 and is cooled by a second fluid in the heat exchanger 126. The now chilled coolant liquid exits the heat exchanger 126 via spraying coolant heat exchanger outlet 118 and is pumped into the spraying coolant supply line 122, which is connected with coolant supply header 110. The cold coolant liquid from coolant supply header 110 may then be distributed into the spray coolant sub supply lines 123 and may then be sprayed through sprayer 111. The second fluid flows into heat exchanger 126 through coolant heat exchanger inlet 121 and flows out through coolant heat exchanger outlet 120. The second fluid can be supplied externally through a dripless connector outlet 105 and a dripless connector inlet 106. A check valve 130 may be used to generally prevent the liquid coolant from flowing backwards. A filter 125 may also be included in one or more locations in the pumping system is a filter. Those skilled in the art, in light of the teachings of the present invention, will readily recognize that components like check valves and filters are common in pumping systems, and that various different configurations of such components could be implemented in various embodiments including, without limitations embodiments without check valves and/or filters.

Referring to the present embodiment, a difference between liquid spray cooling in this embodiment and conventional liquid spray cooling solutions is the direction of liquid drainage. In this embodiment, the liquid generally flows downward and is drained by gravity and spraying momentum due to the vertical position of the heat sinks. In conventional solutions the liquid is typically drained by free flow due to the horizontal position of heat sinks. In practical application of the present embodiment, it is believed that spraying along the longitudinal direction of the fins of the heat sinks may provide higher momentum of the liquid approaching the heat sinks and no obstacle to drain the liquid attached on the heat sink. From a theory of thermal dynamics, the spraying momentum together with gravity can bring higher heat transferring efficiency by forming a thinner boundary layer. While a theory of liquid drainage on heat transfer is that if liquid remains on the heat exchanging surfaces such as, but not limited to heat generating GPUs and CPUs, heat sinks, and heat sink fins, the conductivity through the fluid film created by the liquid is the dominant thermal control mechanism over convection. As a result, the heat transfer away from the heat generating surfaces will likely deteriorate. Therefore, a factor impacting the heat transferring efficiency is the effectiveness of the liquid drainage from the heat exchanging surfaces. This effect may become more pronounced with conventional multi-nozzle spray cooling systems that may produce liquid accumulation or flooding, which can result in a thick and uneven liquid film on the heat exchanging surfaces. Such accumulation not only reduces coolant usage efficiency but also compromises both surface temperature uniformity and cooling performance. In extreme cases, heat transfer, especially in the central region of the heat exchanging surfaces, may shift from spray cooling to highly ineffective pool boiling. In order to help prevent liquid accumulation, various embodiments of the present invention are configured so that the liquid coolant can be sprayed longitudinally (i.e., along the length of the fins of the heat sink). It is contemplated that the longitudinal spray may result in a higher heat transferring coefficient because of quick/clear liquid drainage and a thinner liquid film on the heat sink. A smaller liquid charge amount may also be a result because of the mitigation of liquid collecting between boards/components.

Many embodiments of the present invention can utilize the existing heat sinks on heat the components to be cooled without modification, so there is generally no need to develop new heat sinks specifically for liquid cooling when using these systems. Embodiments may be used in miner/computer server cooling and good heat recovery simultaneously. It is contemplated that this concept could cool virtually any electronic devices with or without heat recovery, including, but not limited to, processors and power electronics devices. Examples of such processors may be one or more CPU, GPU, and tensor processing unit (TPU). Power electronics devices may be one or more semiconductor devices that may include, without limitation, insulated-gate bipolar transistors (IGBT), reverse conducting insulated gate bipolar transistors (RC-IGBT), metal-oxide-semiconductor field-effect transistors (MOSFET), power MOSFETs, diodes, transistors, and/or combinations thereof (e.g., power cards). As an example, the development of AI technologies drives high-performance processors to higher integration and speed and meanwhile, servers involve more processors for each unit to get better calculation capability.

Figure 3A:
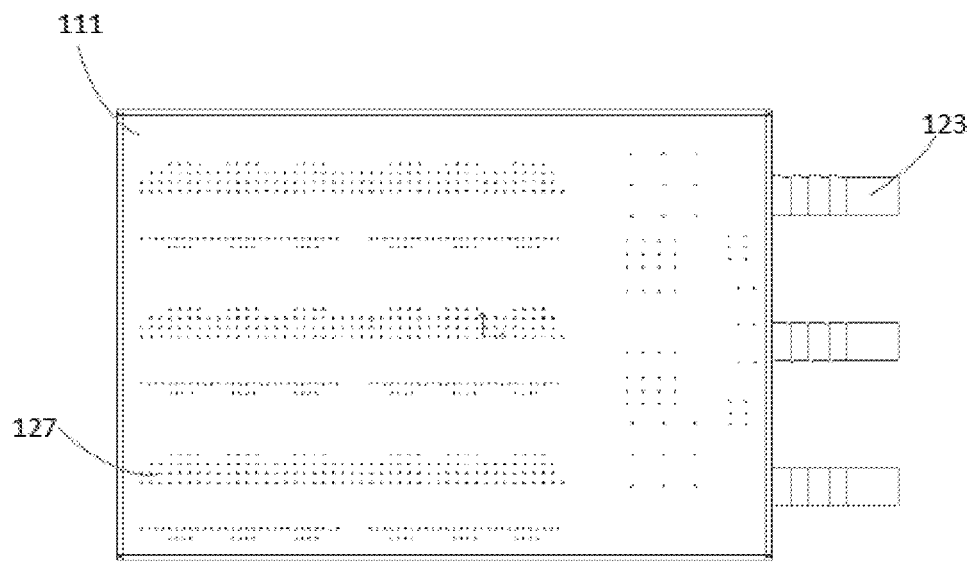
FIGS. 3A and 3B illustrate and exemplary sprayer from a thermal management system, in accordance with an embodiment of the present invention.
Figure 3B:
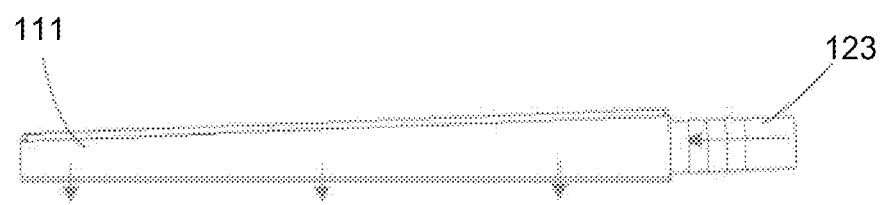

FIGS. 3A and 3B illustrate and exemplary sprayer 111 from a thermal management system, in accordance with an embodiment of the present invention. FIG. 3A is a bottom view, and FIG. 3B is a side view. This type of sprayer 111 may be used for example in the thermal management system illustrated in FIGS. 2A-2F. In the present embodiment, spray holes 127 may be patterned to match the correct mass flow distribution of a particular heat flow distribution on a heat sink. Meaning, flow of liquid is distributed to generally provide more fluid to the areas of the heat sink in higher demand for cooling (i.e., higher surface temperature). The heat sinks underneath sprayer 111 are cooled by the liquid drops exiting holes 127 in sprayer 111. The relative spatial position of holes 127 and the heat sink may determine the position of liquid being sprayed on the surface of the heat sink. Meanwhile, the density of holes 127 and the size of holes 127 determine how much liquid is being sprayed onto the heat sinks underneath. Therefore, design factors when determining the configuration of the holes in a sprayer may include, without limitation, adjusting the size of the holes and the density distribution of the holes to generally ensure enough liquid is being sprayed and adjusting the positions of holes to generally ensure the liquid is being sprayed in the correct position. The holes in the sprayer should be within the projection profile of the heat sink onto the sprayer, by which no hole should be located outside the projection profile to generally prevent any liquid flow from passing between heat sinks. Adjusting the pattern of holes in the sprayer based on the heat load distribution of the heat sink can provide the flexibility to be adaptive to different heat loads created by different working loads, by different models of chips, etc. In practice, the determination of the pattern of holes may also be based on machining skills and cost (i.e., manufacturability). In the present embodiment, the coolant liquid exits the bottom of sprayer 111 through spray holes 127 at a certain speed to properly wet the surface of heat sink fins on a miner or server. The spraying speed may be determined by a complex equilibrium between hole design, pump selection and cooling capacity, which can be obtained by experimental observation of hash board temperature under variable flow volume. There is no certain formula available for the predictive calculation. Examples of observations that may be made when determining the spraying speed may include, without limitation, the following. If the speed of the liquid exiting the holes is too low, the liquid stream out of the holes may join together due to the surface tension and liquid viscosity, and it would be likely that the joined beam will not point to the heat sink as designed. If the speed of the liquid exiting the holes is too high, extra pressure drop can happen. In addition, high-speed liquid impinged onto the heat sink can create a mist of coolant, which may result in an increase the consumption of the coolant.

In practical application of various embodiments of the present invention, decisions may be made to focus on the match between heat sinks and nozzles/sprayers. Details that may be considered include, without limitation, the liquid spraying density, the size of liquid column, the spraying speed, pump selection, spraying parameters tolerant to installation position clearance, reliability, stability, etc. Some embodiments may employ different types of sprayers with different hole sizes, densities, and patterns to distribute the liquid based on the heat load. For example, the total heat load and heat flow density of memory cards are much lower than those of CPU, so, by adjusting the position and density of holes in a sprayer similar to sprayer 111 shown by way of example in FIGS. 3A and 3B, a spraying pattern arranged specifically for the memory cards may be produced. Other embodiments may utilize nozzles rather than sprayers to distribute the liquid coolant. Nozzles may need higher liquid head pressure and larger installation space than sprayers, however, types of spray patterns that can be achieved with nozzles may make nozzles a good alternative solution for some specific applications.

FIGS. 4A through 4F illustrate different spray patterns from nozzles that may be used in accordance with embodiments of the present invention. FIG. 4A shows a nozzle with a pneumatic atomization spray pattern, FIG. 4B shows a nozzle with an axial-flow, hollow cone spray pattern. FIG. 4C shows a nozzle with a tangential-flow hollow cone spray pattern. FIG. 4D shows a nozzle with a full cone spray pattern. FIG. 4E shows a nozzle with a solid stream/tank cleaning spray pattern, and FIG. 4F shows a nozzle with a flat fan spray patter. These various nozzle configurations may suit different types and load requirements of heat sources. Those skilled in the art will readily recognize, in light of and in accordance with the teachings of the present invention, that there are many other types of nozzles that may be used in thermal management systems according to embodiments of the present invention. The types and quantity of nozzles to be adopted in the systems may depend on the characteristics of the heat sources.

Figure 5A:
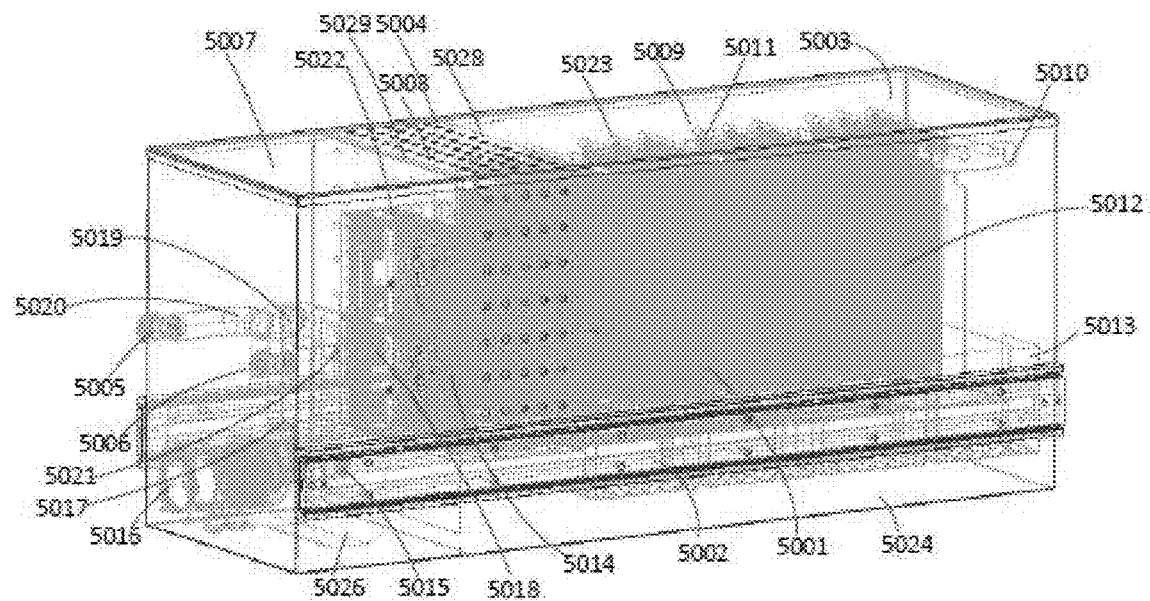
FIGS. 5A through 5C illustrate an exemplary thermal management system comprising spray nozzles to provide liquid spray cooling to cryptocurrency miners, in accordance with the embodiment of the present invention.
Figure 5B:
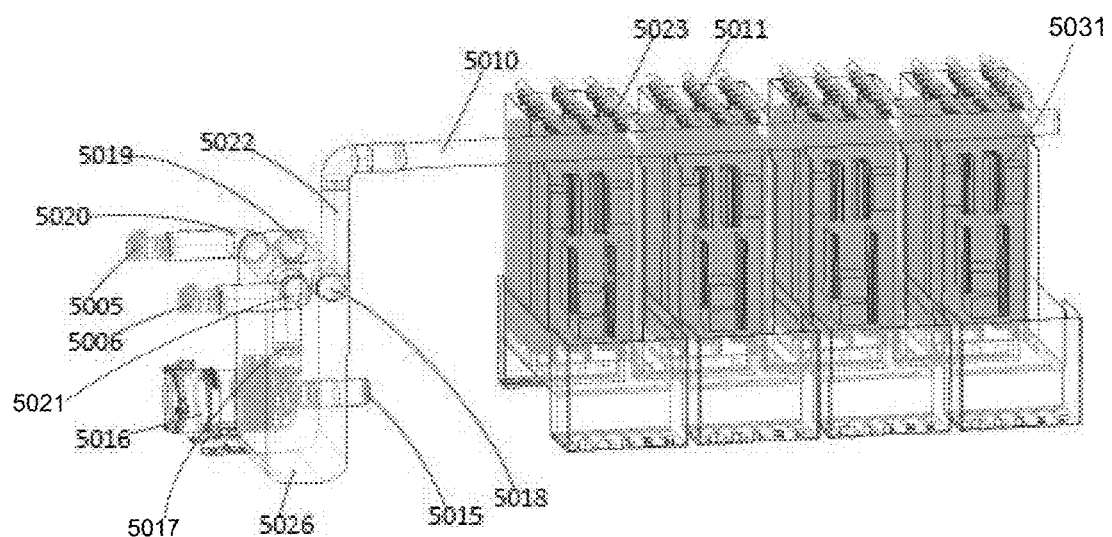
Figure 5C:
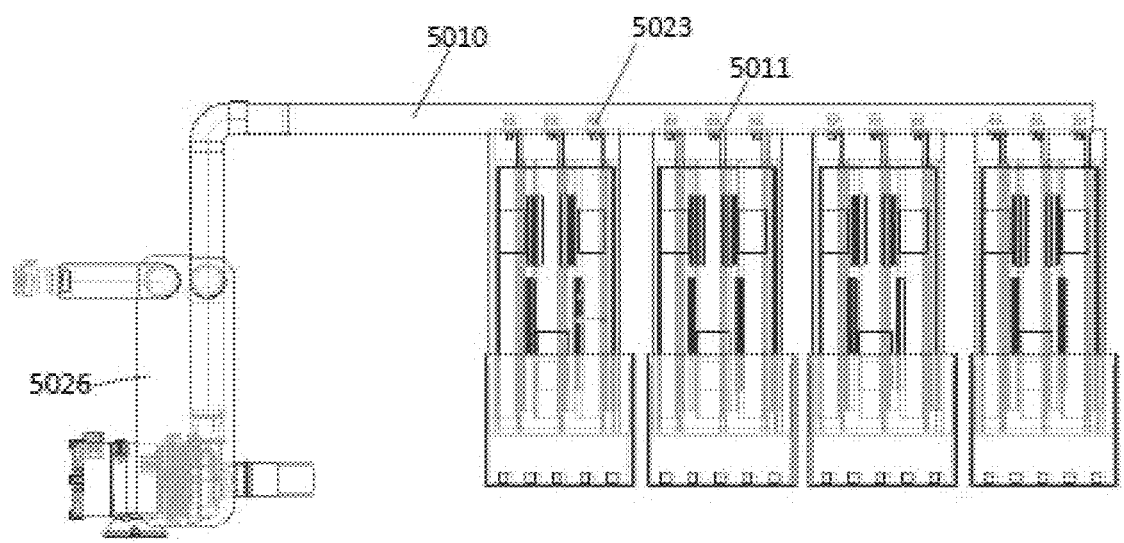

FIGS. 5A through 5C illustrate an exemplary thermal management system comprising spray nozzles 5011 to provide liquid spray cooling to cryptocurrency miners 5012, in accordance with the embodiment of the present invention. FIG. 5A is a partially transparent side perspective view of the thermal management system. FIG. 5B is a side perspective view of a coolant circulation system within the thermal management system, and FIG. 5C is a front view of the spray cooling mechanism. In the present embodiment, a housing 5001 and cover 5003 form a chamber, which could be separated by dividers 5028 and 5029 into three sections, a heat exchanger/pump section 5007, an electrical power section 5008 and a spray cooling section 5009. Each section is isolated from the other sections. Sliding rails 5002 may be disposed on the outer surface of housing 5001. A coolant supply header 5010, spray nozzles 5011, miners 5012, a supporting frame 5013, a pump suction port 5015, spray coolant sub supply lines 5023, and a reservoir 5024 may be included in spray cooling section 5009. In typical use of the present embodiment, coolant liquid from coolant supply header 5010 flows into the spray coolant sub supply lines 5023 of spray nozzles 5011, and then may be pushed through the spray nozzles 5011. The cold coolant liquid from the spray nozzles 5011 may be sprayed down into the miners 5012 underneath in a certain pattern to carry the heat from miners 5012 away. The heated coolant liquid may then be collected in reservoir 5024 under the miners 5012.

The spray cooling section 5009 can hold more than one miner 5012, relevant spray nozzle 5011 and other components including supporting frame 5013 and spray coolant sub supply line 5023. The quantity of miners 5012 may depend on the total heat capacity of miners 5012. Multiple miners 5012 and relevant components share the common reservoir 5024, which collects the heated coolant liquid that drain from miners 5012 after being sprayed onto miners 5012 in a downward direction. The reservoir 5024 may be connected to a circulation pump 5016 by a pump suction port 5015, which connects to a circulation pump 5016 that may act to pump the liquid from the reservoir 5024 and into a heat exchanger 5026 to re-cool the liquid before being recirculated to the spray nozzles 5011. The volume of reservoir 5024 is typically designed to be as small as possible mostly based on how effectively the circulation pump 5016 can suction the heated liquid safely.

The chamber formed by the spray cooling section 5009 and cover 5003 may be made to be airtight, which helps to prevent the loss of coolant liquid by liquid evaporation or droplet drift. The spray nozzles 5011 are located above the top of miners 5012 to generally ensure that coolant liquid can be sprayed straight downward. The coolant supply header 5010 may be connected to one or more spray coolant sub supply lines 5023 which are then connected to each spray nozzle 5011. The spray coolant sub supply line 5023 may be made by flexible tubes. However, some embodiments may comprise non-flexible connections for the coolant sub supply lines. The miners 5012 seat on the supporting frame 5013 and supporting frame may comprise holes to enable coolant liquid to flow through into the reservoir 5024.

The spray nozzles 5011 may be configured to match the correct mass flow distribution to the heat flow distribution on the heat sink. At first, the location of nozzles 5011 should match the positions of heat sources to generally ensure the heat sinks 5012 are accessible by the spraying liquid. Secondly, the type of nozzle (e.g., can be a cone sprayer, a chamber with holes or any type of commercial sprayer) is selected to effectively wet the heat sinks attached to the heat sources. Thirdly, the piping system should be designed to distribute the fluid to spray nozzles 5011 evenly. The coolant liquid out of spray nozzles 5011 approaches fins 5031 of the heat sinks vertically and at a certain speed to wet the surface of fins 5031, flush the surface of fins 5031 from top to bottom in a longitudinal direction, and drip into the reservoir 5024. During this flow process, spray momentum and gravity work together to increase the forced convective heat transfer coefficient when compared to the natural convective heat transfer coefficient in a liquid immersive tub solution.

The electrical power section 5008 is beside the spray cooling section 5009. In the present embodiment, the original power source modules 5014 of miners 5012 may be removed from miners 5012 and put in the electrical power section 5008. The cooling medium in the electrical power section 5008 is air, which may be driven by fans in the power source modules 5014 through ventilation holes 5004. Moving power source modules 5014 out of the spray cooling section 5009 may enable the present embodiment to take advantage of the higher maximum working temperature of the miners 5012 and may allow the liquid coolant in the spray cooling section 5009 to reach a higher temperature when absorbing heat from the miners 5012. In addition, heat generation power from miner 5012 typically take 90% of the total input power and power source modules 5014 typically take 10% of the total input power in normal application. Therefore, higher heat recovery temperature and more recovery power may be achieved by cooling the power sources and miner chips separately. Moreover, this design may also provide the flexibility to enable the miners 5012 to perform an overlocking application by providing extra space in the electrical power section 5008 for an additional power source to power this overlocking application.

The heat exchanger/pump section 5007 may be placed beside the electrical power section 5008 and may hold pump suction port 5015, circulation pump 5016, pump discharging port 5017, a spraying coolant heat exchanger outlet 5018, a spraying coolant heat exchanger inlet 5019, a coolant heat exchanger outlet 5020, a coolant heat exchanger inlet 5021, a spraying coolant supply line 5022, a filter, and heat exchanger 5026. heated coolant liquid from reservoir 5024 may be suctioned into the pump suction port 5015, which runs under the electrical power section 5008 and to connect to the spray cooling section 5009. Circulation pump 5016 may be mounted at the bottom of housing 5001 to pump the coolant liquid out through pump discharging port 5017. The circulation pump 5016 could be virtually any type of pump that meets the flow and header parameters required by the system. The coolant liquid exiting the pump discharging port 5017 may be pumped into the spraying coolant heat exchanger inlet 5019 as the first fluid to be cooled by a second fluid in the heat exchanger 5026. The cold coolant liquid (as the first fluid) exiting spraying coolant heat exchanger outlet 5018 may then be pumped into the spraying coolant supply line 5022, which is connected to coolant supply header 5010. The cold coolant liquid exiting coolant supply header 5010 may then be distributed into the spray coolant sub supply lines 5023 and then be sprayed through sprayer nozzles 5011. The second fluid flows into heat exchanger 5026 through coolant heat exchanger inlet 5021 and flows out through coolant heat exchanger outlet 5020. The second fluid is supplied externally through a dripless connector inlet 5006 and leaves the system through a dripless connector outlet 5005. The coolant liquid used in the system could be virtually any type of single-phase dielectric fluids, such as, but not limited to, mineral oil, natural/synthetic ester oil, silicone oil, Fluorinert fluids, etc.

Figure 6A:
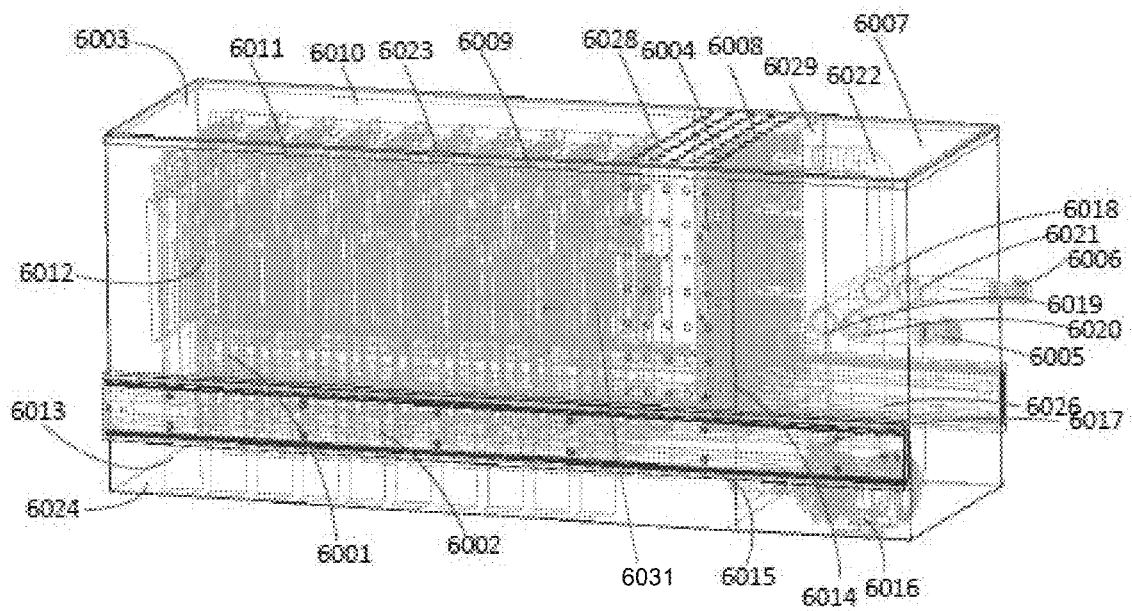
FIGS. 6A through 6D illustrate an exemplary thermal management system comprising sprayers to provide liquid spray cooling to computer servers, in accordance with the embodiment of the present invention.
Figure 6B:
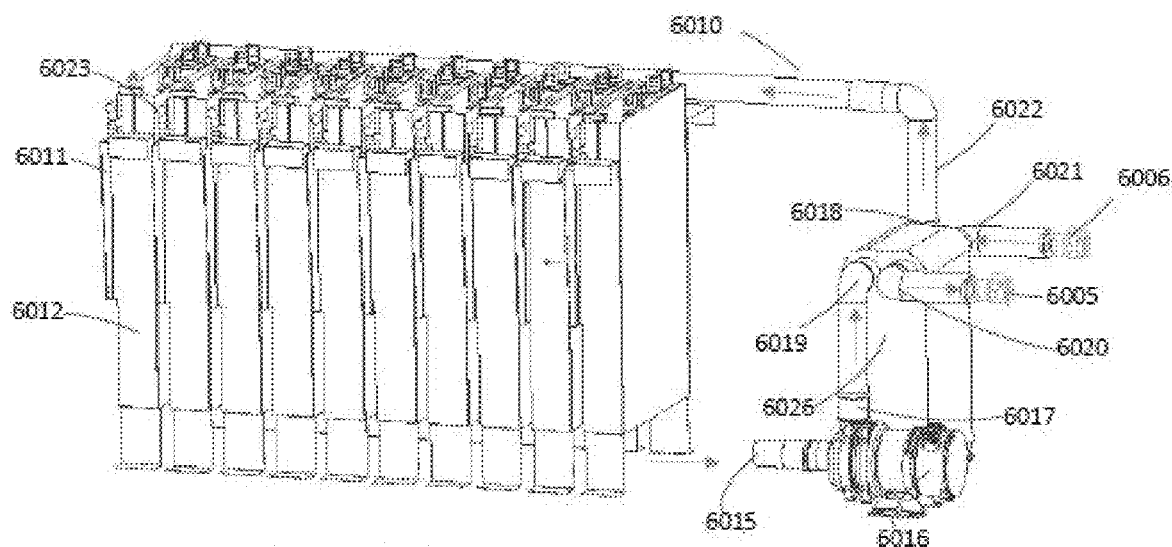
Figure 6C:
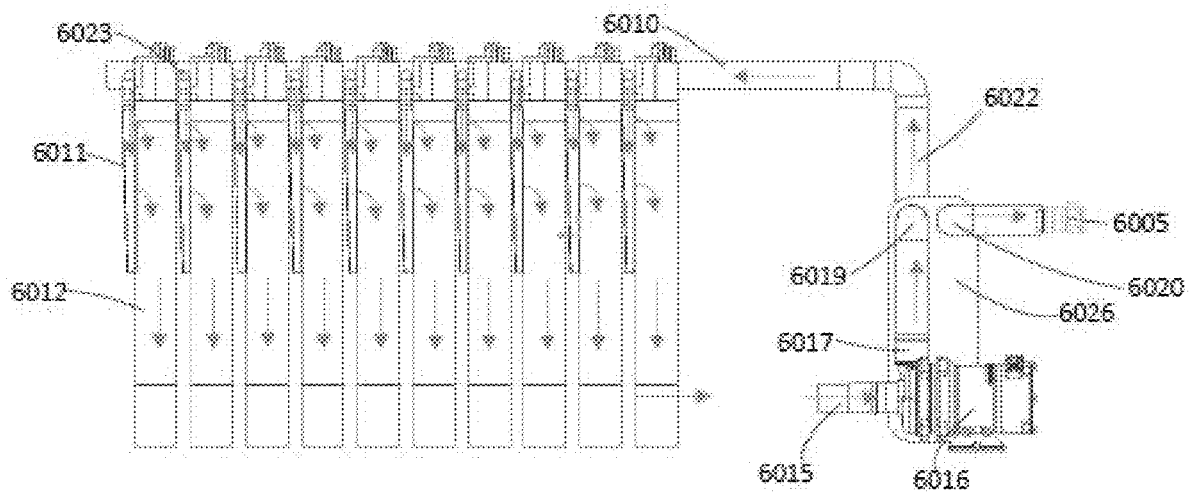
Figure 6D:
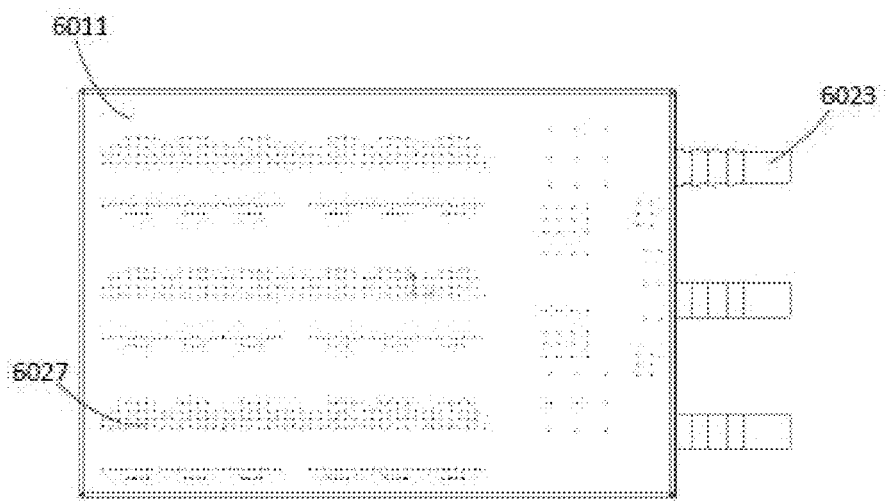

FIGS. 6A through 6D illustrate an exemplary thermal management system comprising sprayers 6011 to provide liquid spray cooling to computer servers 6012, in accordance with the embodiment of the present invention. FIG. 6A is a partially transparent side perspective view of the thermal management system. FIG. 6B is a side perspective view of a coolant circulation system within the thermal management system. FIG. 6C is a front view of the spray cooling mechanism, and FIG. 6D is a bottom view of an exemplary sprayer 6011. In the present embodiment, a housing 6001 and a cover 6003 form a chamber, which may be separated into three sections, a heat exchanger/pump section 6007, an electrical power section 6008, and a spray cooling section 6009 by dividers 6028 and 6029. Each section is isolated from the other sections. Sliding rails 6002 may be disposed on the outer surface of housing 6001. A coolant supply header 6010, sprayers 6011, computer servers 6012, a supporting frame 6013, a pump suction port 6015, spray coolant sub supply lines 6023, and a reservoir 6024 may be included in spray cooling section 6009. In typical use of the present embodiment coolant liquid from coolant supply header 6010 flows into the spray coolant sub supply lines 6023 of sprayers 6011 and is then pushed through holes 6027 disposed in the bottom of sprayers 6011. The cold coolant liquid from the sprayers 6011 may be sprayed into the computer servers 6012 from the sides in a certain pattern to carry the heat away from servers 6012. The heated coolant liquid may then be collected in reservoir 6024 under the computer servers 6012.

The spray cooling section 6009 can hold more than one computer server 6012, relevant sprayers 6011 and other components including, but not limited to, supporting frame 6013 and spray coolant sub supply lines 6023. The quantity of servers 6012 that may be placed in spray cooling section 6009 typically depends on the total heat capacity of servers 6012. Multiple servers 6012 and relevant components share the common reservoir 6024, which collects the heated coolant liquid that drains out of servers 6012. The reservoir 6024 may be connected to the pump suction port 6015, which connects to a circulation pump 6016 that may act to pump the liquid from the reservoir 6024 and into a heat exchanger 6026 to re-cool the liquid before being recirculated to the sprayers 6011. The volume of reservoir 6024 would be designed as small as possible mostly based on how effectively the circulation pump 6016 can suction the liquid safely.

The chamber formed by the spray cooling section 6009 and cover 6003 may be made to be airtight to help prevent the loss of coolant liquid by liquid evaporation or droplet drift. In the present embodiment, the servers 6012 are seated vertically into the support frame 6013, and the sprayers 6011 are placed vertically between every two servers 6012. Sprayers 6011 may spray the coolant liquid onto the sides of servers 6012 laterally, and then gravity will cause the coolant liquid to flow laterally down the sides of the servers 6012 and into the reservoir 6024. The supporting frame 6013 comprises holes through which the coolant liquid can flow through. The coolant supply header 6010 may be connected with one or more spray coolant sub supply lines 6023 connected to each sprayer 6011. The spray coolant sub supply line 6023 could be made from flexible tubes, by which the sprayers 6011 could be pushed upward or to the side to remove the servers 6012 for service purposes. Alternate embodiments may be implemented without flexible tubes.

In the present embodiment, the holes 6027 in the sprayers 6011 may be patterned to match the correct mass flow distribution to the heat flow distribution on the heat sinks. The coolant liquid exiting sprayers 6011 may approach fins 6031 of the heat sink along the longitudinal direction of heat sink fins 6031 at a certain speed to wet the surface of fins 6031, flush the surface of the fins 6031 from top to bottom, and drip into the reservoir 6024. There are many heat sinks in a server, the surface of fins 6031 generally refer to all surface of heat sinks, which may include, without limitation, the heat sink of the CPU, the heat sink of graphic card, or power sources. During this flow process, spray momentum and gravity work together to increase the forced convective heat transfer coefficient as compared to the natural convective heat transfer coefficient in liquid immersive tub solutions.

The electrical power section 6008 may be located beside the spray cooling section 6009. The original power source modules 6014 may be removed from servers 6012 and placed in the electrical power section 6008. The cooling medium in the electrical power section 6008 is air, which may be driven by the fans in the power source modules 6014 through ventilation holes 6004. Moving power source modules 6014 out of the spray cooling section 6009 may enable the present embodiment to take advantage of the higher maximum working temperature of the servers 6012 and may allow the liquid coolant in the spray cooling section 6009 to reach a higher temperature when absorbing heat from the servers. In addition, higher heat recovery temperature and more recovery power could be achieved by cooling the power sources and miner chips separately as explained previously with regard to other embodiments.

The heat exchanger/pump section 6007 may be placed beside the electrical power section 6008. The internal volume of the heat exchanger/pump section 6007 may hold pump suction port 6015, circulation pump 6016, a pump discharging port 6017, a spraying coolant heat exchanger outlet 6018, a spraying coolant heat exchanger inlet 6019, a coolant heat exchanger outlet 6020, a coolant heat exchanger inlet 6021, a spraying coolant supply line 6022, a filter, and heat exchanger 6026.

The heated coolant liquid that ends up in reservoir 6024 may be suctioned into the pump suction port 6015, which may be located under the electrical power section 6008 and connected to spray cooling section 6009. Circulation pump 6016 may be mounted at the bottom of housing 6001 and may pump the coolant liquid out through pump discharging port 6017. The circulation pump 6016 could be virtually any type of pump that meets the requirements of the system. The coolant liquid exiting the pump discharging port 6017 may be pushed into the spraying coolant heat exchanger inlet 6019 as the first fluid to be cooled by a second fluid in the heat exchanger 6026. The cold coolant liquid (as the first fluid) exits the heat exchanger 6026 via the spraying coolant heat exchanger outlet 6018 and may then be pumped into the spraying coolant supply line 6022, which is connected to coolant supply header 6010. The cold coolant liquid from coolant supply header 6010 may then be distributed into the spray coolant sub supply lines 6023 to be sprayed through sprayers 6011. The second fluid flows into heat exchanger 6026 through coolant heat exchanger inlet 6021 and flows out through coolant heat exchanger outlet 6020. The second fluid may be supplied externally through a dripless connector outlet 6005 and a dripless connector inlet 6006. The coolant liquid could be virtually any type of single-phase dielectric fluids, such as, but not limited to, mineral oil, natural/synthetic ester oil, silicone oil, Fluorinert fluids, etc.

Figure 7A:
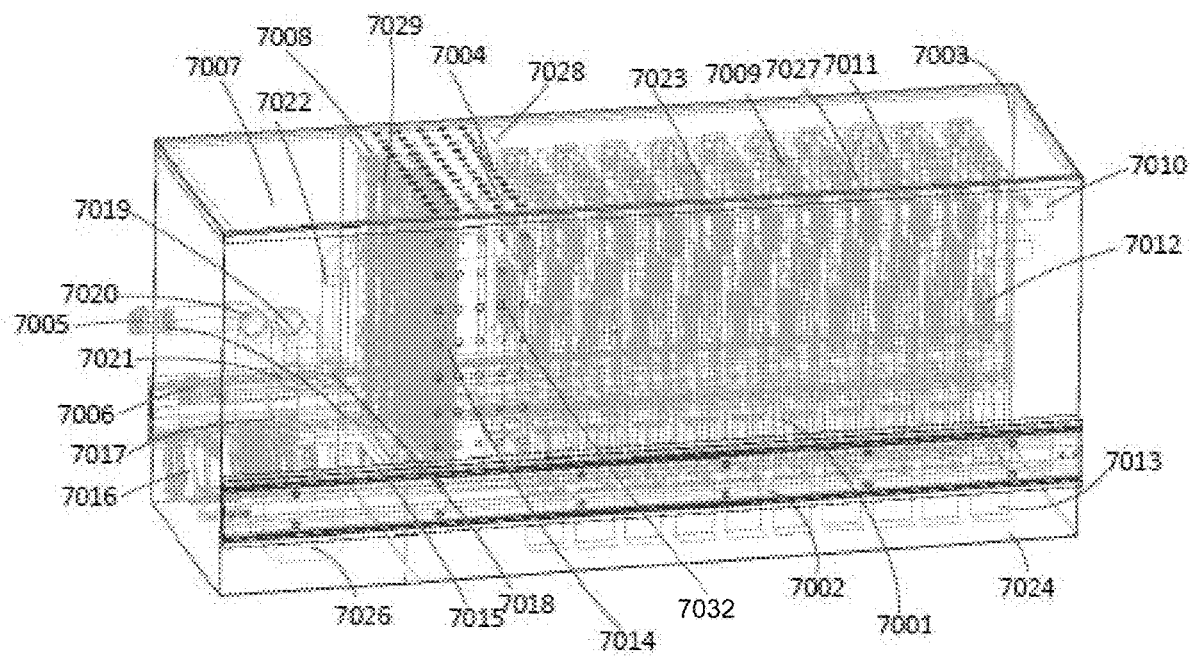
FIGS. 7A through 7D illustrate an exemplary thermal management system comprising spray nozzles 7011 to provide liquid spray cooling to computer servers 7012, in accordance with the embodiment of the present invention.
Figure 7B:
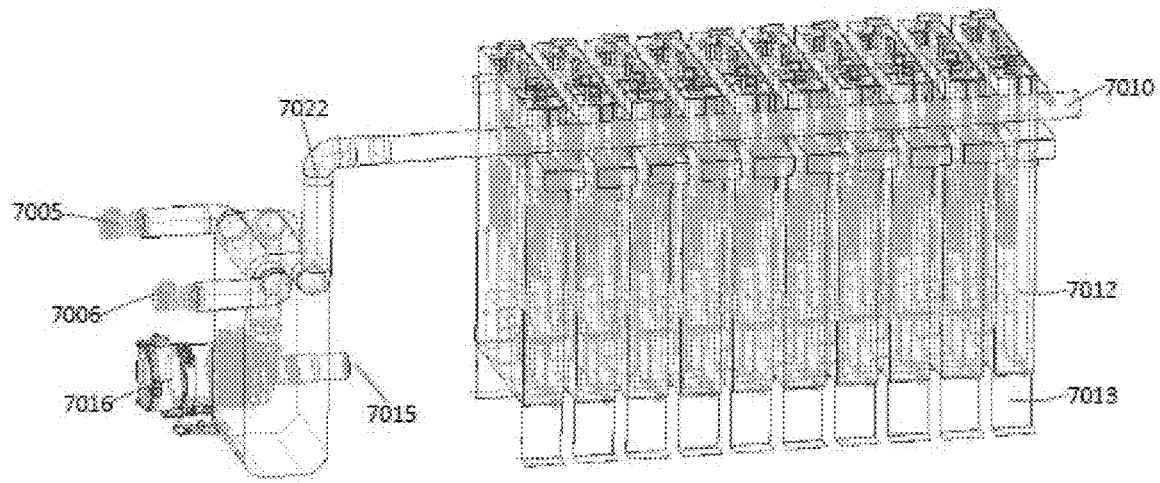
Figure 7C:
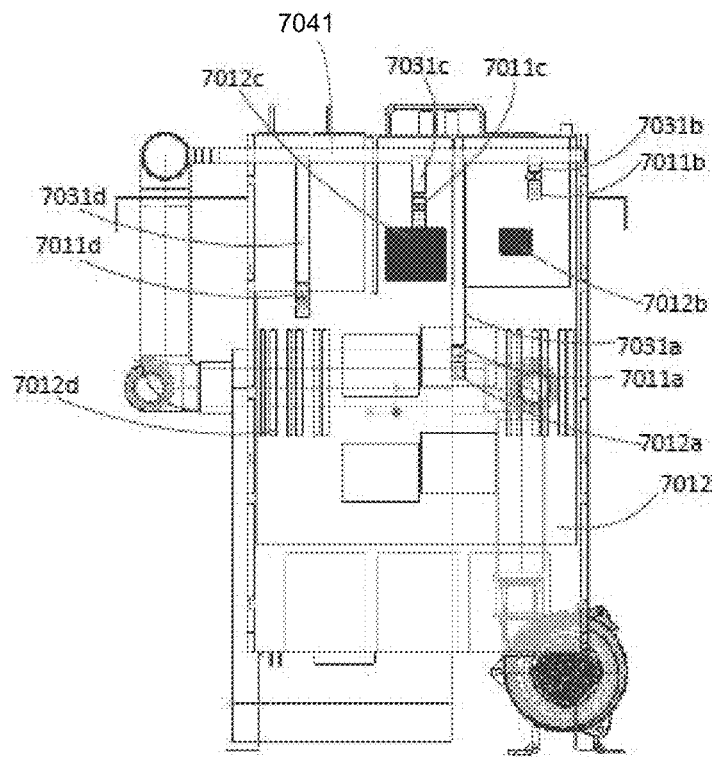
Figure 7D:
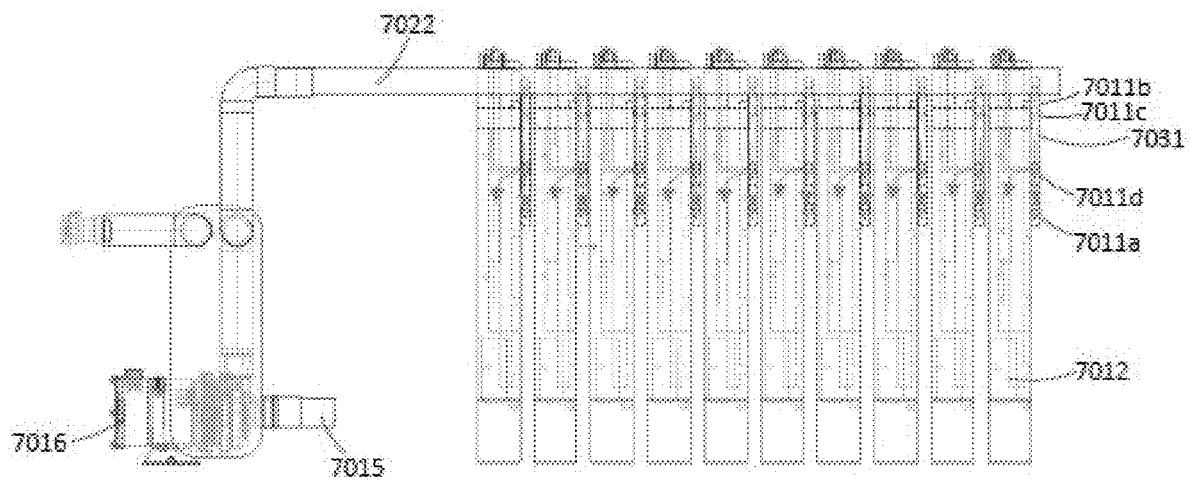

FIGS. 7A through 7D illustrate an exemplary thermal management system comprising spray nozzles 7011 to provide liquid spray cooling to computer servers 7012, in accordance with the embodiment of the present invention. FIG. 7A is a partially transparent side perspective view of the thermal management system. FIG. 7B is a side perspective view of a spraying subsystem within the thermal management system. FIG. 7C is a side view of the spraying subsystem, and FIG. 7D is a front view of the spray cooling mechanism. In the present embodiment, a housing 7001 and cover 7003 form a chamber, which may be separated into three sections, a heat exchanger/pump section 7007, an electrical power section 7008, and a spray cooling section 7009, by dividers 7028 and 7029. Each section may be isolated from each of the other sections. Sliding rails 7002 may be disposed on the outer surface of housing 7001. A coolant supply header 7010, spray nozzles 7011, computer servers 7012, a supporting frame 7013, a pump suction port 7015, spray coolant sub supply lines 7023, and a reservoir 7024 may be included in spray cooling section 7009. In typical use of the present embodiment, coolant liquid coming from coolant supply header 7010 may flow into the spray coolant sub supply lines 7023 of spray nozzles 7011 to then be sprayed through the spray nozzles 7011. The cold coolant liquid from the spray nozzles 7011 may be sprayed into the computer servers 7012 to carry the heat away from servers 7012. The heated coolant liquid may be collected in reservoir 7024 under the computer servers 7012.

The spray cooling section 7009 can hold more than one computer server 7012, relevant spray nozzle 7011 and other components including, but not limited to, supporting frame 7013 and spray coolant sub supply lines 7023. The multiple computer servers 7012 and relevant components share the common reservoir 7024. The reservoir 7024 may be connected to the pump suction port 7015, which connects to a circulation pump 7016 that may act to pump the liquid from the reservoir 7024 and into a heat exchanger 7026 to re-cool the liquid before being recirculated to the nozzles 7011. The volume of reservoir 7024 may be designed as small as possible mostly based on how effectively the pump 7016 can suction the liquid safely.

The chamber formed by the spray cooling section 7009 and cover 7003 may be airtight to help prevent the loss of coolant liquid by liquid evaporation or droplet drift. The spray nozzles 7011 may be located at the sides of a computer servers 7012 so that nozzles 7011 are placed between every two computer servers 7012, which may enable the coolant liquid to be sprayed laterally onto computer servers 7012. The coolant supply header 7010 may be connected to one or more spray coolant sub supply lines 7023 for each spray nozzle 7011. The spray coolant sub supply lines 7023 may be made from flexible tubes or may be made of other types of materials such as, but not limited to rigid tubes. The computer servers 7012 can be seated on the supporting frame 7013 in a vertical orientation, and the supporting frame 7013 may comprise holes to let the coolant liquid flow through to the reservoir 7024.

In the present embodiment, the spray nozzles 7011 may be configured to match the correct mass flow distribution to the heat flow distribution on the heat sink. The coolant liquid exiting spray nozzles 7011 may approach the fins 7032 of the heat sinks laterally at a certain speed, wet the surface of fins 7032, flush the surfaces of the fins 7032 from top to bottom, and drip to the reservoir 7024. While fins 7032 are shown in the present embodiment, and other fins are shown in other embodiments illustrated by way of example in the drawings, there may be many heat sinks in a server, for example, without limitation the heat sink of the CPU, the heat sink of graphic card, or power sources, etc. and fins in alternate embodiments may be located in different areas of the server. In the present embodiment, during this flow process, spray momentum and gravity work together to increase the forced convective heat transfer coefficient as compared to the natural convective heat transfer coefficient in liquid immersive tub solutions. More specifically, the spray nozzles 7011 could be arranged according to the location of heat sources. Referring to FIG. 7C, nozzles 7011a, 7011b, 7011c and 7011d are located by the position of servers (i.e., heat sources) 7012a, 7012b, 7012c and 7012d respectively. Since the coolant liquid approaches the heat sink on servers 7012 laterally, the location of nozzles 7011 may be placed higher than the geometrical center of the heat sinks regarding the composition of gravity and spraying momentum. The exact comparative position between nozzles 7011 and the heat sinks depends mostly on the type of heat sink and the type of nozzles 7011. As illustrated by way of example in FIG. 4, different nozzles can have different spraying angles, speeds, sizes, and flowrates. It is contemplated that the coordination between heat sinks and nozzles will likely be done on a system-by-system basis. In the present embodiment four branches 7031a, 7031b, 7031c, and 7031d are shown to supply fluid to nozzles 7011. The positions of branches 7031a, 7031b, 7031c, and 7031d typically rely on the locations of heat sources. Referring to FIG. 7C, a liquid supply header 7041 for each server is connected with a spraying coolant supply line 7022. The liquid in liquid supply header 7041 may be divided into several branches 7031a, 7031b, 7031c and 7031d to supply fluid to nozzles 7011a, 7011b, 7011c, and 7011d. In alternate embodiments, more branches may be included based on the heat resources in the motherboard.

The original power source modules 7014 may be removed from servers 7012 and placed in the electrical power section 7008. The cooling medium in the electrical power section 7008 is air, which may be driven by fans in the power source modules through the ventilation holes 7004. Moving power source modules 7014 out of the spray cooling section 7009 may enable the present embodiment to take advantage of the higher maximum working temperature of the servers 7012 and may allow the liquid coolant in the spray cooling section 7009 to reach a higher temperature when absorbing heat from the servers. In addition, higher heat recovery temperature and more recovery power could be achieved by cooling the power sources and miner chips separately as explained previously with regard to other embodiments.

The internal volume of the heat exchanger/pump section 7007 may hold pump suction port 7015, circulation pump 7016, a pump discharging port 7017, a spraying coolant heat exchanger outlet 7018, a spraying coolant heat exchanger inlet 7019, a coolant heat exchanger outlet 7020, a coolant heat exchanger inlet 7021, a spraying coolant supply line 7022, a filter, and heat exchanger 7026. The heated coolant liquid in reservoir 7024 may be suctioned into the pump suction port 7015, which is located under the electrical power section 7008 and connected to spray cooling section 7009. Circulation pump 7016 may be mounted at the bottom plate of housing 7001 and may pump the coolant liquid out of pump discharging port 7017. The circulation pump 7016 could be virtually any type of pump that meets the required flow and header of the system. The coolant liquid exiting the pump discharging port 7017 may then be pushed to the spraying coolant heat exchanger inlet 7019 as the first fluid to be cooled by the second fluid in the heat exchanger 7026. The cold coolant liquid (as the first fluid) exiting the spraying coolant heat exchanger outlet 7018 may then be pumped into the spraying coolant supply line 7022, which is connected to coolant supply header 7010. The cold coolant liquid from coolant supply header 7010 may then be distributed to the spray coolant sub supply lines 7023 and then sprayed through nozzles 7011. The second fluid flows into heat exchanger 7026 through coolant heat exchanger inlet 7021 and flows out through coolant heat exchanger outlet 7020. The second fluid may be supplied externally through a dripless connector outlet 7005 and a dripless connector inlet 7006. The coolant liquid could be virtually any type of single-phase dielectric fluids, such as, but not limited to, mineral oil, natural/synthetic ester oil, silicone oil, or Fluorinert fluids.

Figure 8A:
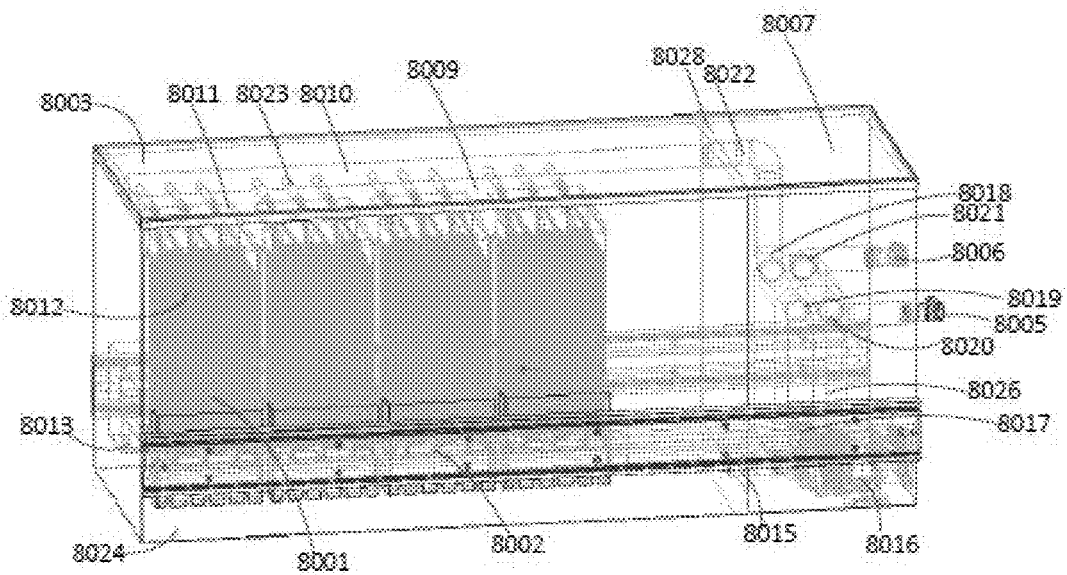
FIGS. 8A through 8C illustrate an exemplary two-chamber thermal management system that may provide liquid spray cooling to IT components, in accordance with the embodiment of the present invention.
Figure 8B:
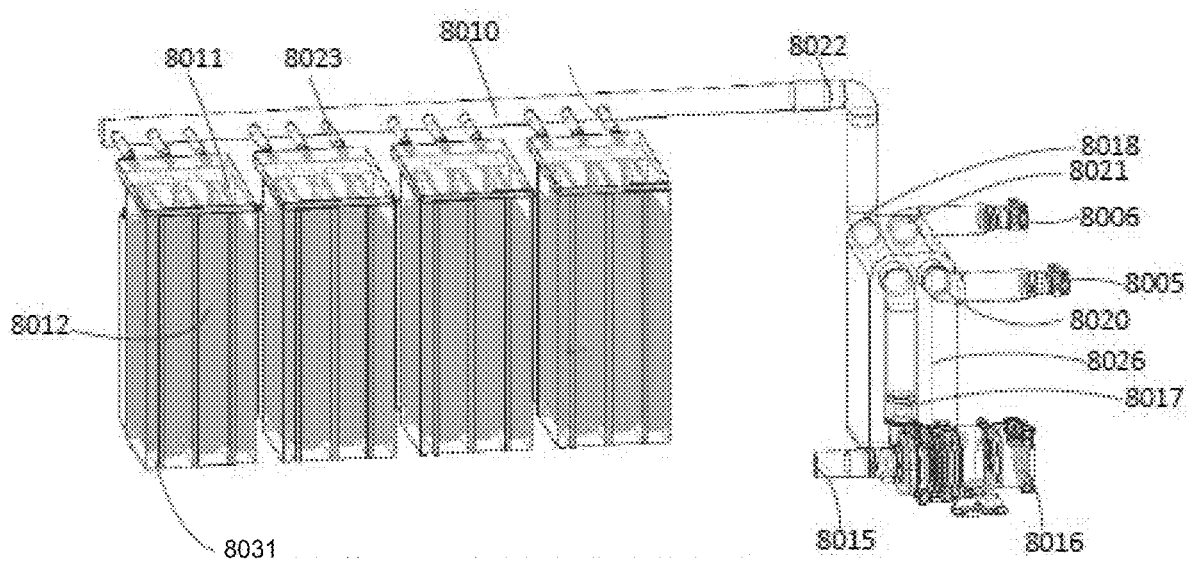
Figure 8C:
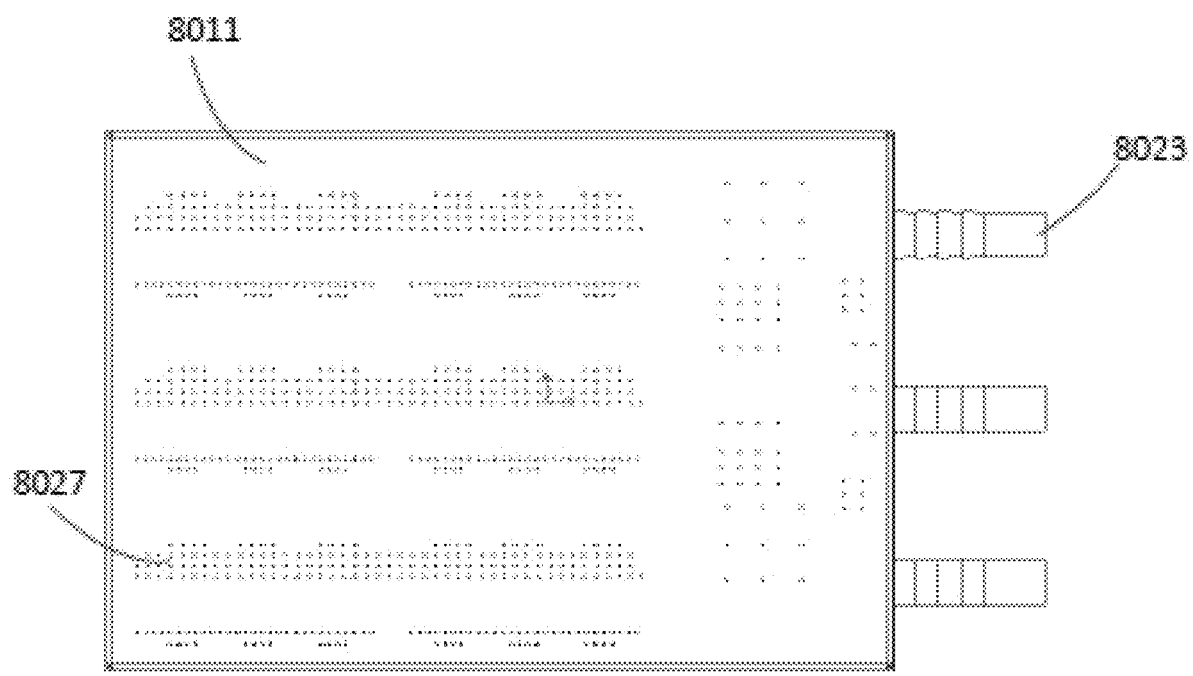

FIGS. 8A through 8C illustrate an exemplary two-chamber thermal management system that may provide liquid spray cooling to IT components, in accordance with the embodiment of the present invention. FIG. 8A is a partially transparent side perspective view of the thermal management system. FIG. 8B is a side perspective view of a coolant circulation system within the thermal management system, and FIG. 8C is a bottom view of an exemplary sprayer 8011. In the present embodiment, a housing 8001 comprises two sections, a heat exchanger/pump section 8007, and a spray cooling section 8009, which are separated by a divider 8028. Each section is isolated from the other. A sliding rail 8002 may be included on the exterior of housing 8001. A. coolant supply header 8010, sprayers 8011, miners 8012, a supporting frame 8013, a pump suction port 8015, a spray coolant sub supply line 8023, and a reservoir 8024 may be included in spray cooling section 8009. In typical use of the present embodiment coolant liquid from coolant supply header 8010 flows into the spray coolant sub supply lines 8023 of each sprayer 8011 and may then be pushed through spray holes 8027 in sprayers 8011. The cold coolant liquid from the spray holes 8027 may be sprayed downward into the miners 8012 underneath in a certain pattern to carry the heat away from miners 8012. The heated coolant liquid may then be collected in reservoir 8024 under the miners 8012.

The spray cooling section 8009 can hold more than one miner 8012, relevant sprayer 8011 and other components including, without limitation, supporting frame 8013 and spray coolant sub supply lines 8023. The quantity of miners may depend on the total heat capacity of miners 8012. Multiple miners 8012 and relevant components share the common reservoir 8024, which collects the heated coolant liquid dripped out of miners 8012. The reservoir 8024 may be connected to the pump suction port 8015, which connects to a circulation pump 8016 that may act to pump the liquid from the reservoir 8024 and into a heat exchanger 8026 to re-cool the liquid before being recirculated to the sprayers 8011. The volume of reservoir 8024 may be designed to be as small as possible mostly based on the ability of the circulation pump 8016 to suction liquid safely.

The chamber formed by the spray cooling section 8009 and a cover 8003 may be made airtight to help prevent the loss of coolant liquid by liquid evaporation or droplet drift. The sprayers 8011 may be located above miner 8012 to generally ensure that coolant liquid can be sprayed downward at a straight angle. The coolant supply header 8010 may be connected with one or more spray coolant sub supply lines 8023 of each sprayer 8011. In some embodiments, the spray coolant sub supply lines 8023 could be made from flexible tubes, which may enable the sprayers 8011 to be pushed upward or outward to provide access to remove the miners 8012 for service purposes. The miners 8012 may be seated on the supporting frame 8013 in a vertical orientation, and supporting frame 8013 may comprise holes or openings to let the coolant liquid flow through and into the reservoir 8024 below.

The spray holes 8027 in sprayers 8011 may be patterned to match the correct mass flow distribution to the heat flow distribution on the heat sinks. The coolant liquid out of sprayers 8011 may approach fins 8031 on the heat sinks vertically (i.e., perpendicular to the horizon) at a certain speed, wet the surface of fins 8031, flush the surfaces of fins 8031 from top to bottom in a longitudinal direction, and drip to the reservoir 8024. During this flow process, spray momentum and gravity work together to increase the forced convective heat transfer coefficient as compared to the natural convective heat transfer coefficient in liquid immersive tub solutions. This embodiment cools the electronic devices (i.e., miners 8012) together with their electrical power sources. Referring to the aforementioned maximum temperature discrepancy, the power sources typically cannot work at the higher maximum temperature of miners 8012. Therefore, in this design, the spraying coolant liquid temperature meets the requirements of the lower limits of electrical power sources. This design may be applicable for the lower tier energy efficiency data center applications and cryptocurrency mining rack and farm applications.

The internal volume of the heat exchanger/pump section 8007 may hold pump suction port 8015, circulation pump 8016, a pump discharging port 8017, a spraying coolant heat exchanger outlet 8018, a spraying coolant heat exchanger inlet 8019, a coolant heat exchanger outlet 8020, a coolant heat exchanger inlet 8021, a spraying coolant supply line 8022, a filter, and heat exchanger 8026. The circulation pump 8016 may be virtually any type of pump that meets the flow and header needs of the system. Within the heat exchanger/pump section 8007, the heated coolant liquid from reservoir 8024 may be suctioned into the pump suction port 8015, which is located at the bottom of reservoir 8024 and connected to spray cooling section 8009. Circulation pump 8016 pumps the coolant liquid out through pump discharging port 8017 into the spraying coolant heat exchanger inlet 8019 as the first fluid in the heat exchanger 8026 to be cooled by a second fluid in the heat exchanger 8026. The cold coolant liquid (as the first fluid) exits heat exchanger 8026 through spraying coolant heat exchanger outlet 8018 and it then pumped into the spraying coolant supply line 8022, which is connected to coolant supply header 8010. The cold coolant liquid from coolant supply header 8010 may then be distributed into the spray coolant sub supply lines 8023 to then be sprayed through sprayers 8011. The second fluid flows into heat exchanger 8026 through coolant heat exchanger inlet 8021 and flows out of heat exchanger 8026 through coolant heat exchanger outlet 8020. The second fluid may be supplied externally through a dripless connector outlet 8005 and a dripless connector inlet 8006. The coolant liquid could be any type of single-phase dielectric fluids, such as, but not limited to, mineral oil, natural/synthetic ester oil, silicone oil, Fluorinert fluids, etc.

Those skilled in the art will readily recognize, in light of and in accordance with the teachings of the present invention, that any of the foregoing steps may be suitably replaced, reordered, removed and additional steps may be inserted depending upon the needs of the particular application. Moreover, the prescribed method steps of the foregoing embodiments may be implemented using any physical and/or hardware system that those skilled in the art will readily know is suitable in light of the foregoing teachings. For any method steps described in the present application that can be carried out on a computing machine, a typical computer system can, when appropriately configured or designed, serve as a computer system in which those aspects of the invention may be embodied.

All the features disclosed in this specification, including any accompanying abstract and drawings, may be replaced by alternative features serving the same, equivalent, or similar purpose, unless expressly stated otherwise. Thus, unless expressly stated otherwise, each feature disclosed is one example only of a generic series of equivalent or similar features.

It is noted that according to USA law 35 USC § 112 (1), all claims must be supported by sufficient disclosure in the present patent specification, and any material known to those skilled in the art need not be explicitly disclosed. However, 35 USC § 112 (6) requires that structures corresponding to functional limitations interpreted under 35 USC § 112 (6) must be explicitly disclosed in the patent specification. Moreover, the USPTO's Examination policy of initially treating and searching prior art under the broadest interpretation of a "mean for" or "steps for" claim limitation implies that the broadest initial search on 35 USC § 112(6) (post AIA 112(f)) functional limitation would have to be conducted to support a legally valid Examination on that USPTO policy for broadest interpretation of "mean for" claims. Accordingly, the USPTO will have discovered a multiplicity of prior art documents including disclosure of specific structures and elements which are suitable to act as corresponding structures to satisfy all functional limitations in the below claims that are interpreted under 35 USC § 112(6) (post AIA 112(f)) when such corresponding structures are not explicitly disclosed in the foregoing patent specification. Therefore, for any invention element(s)/structure(s) corresponding to functional claim limitation(s), in the below claims interpreted under 35 USC § 112(6) (post AIA 112(f)), which is/are not explicitly disclosed in the foregoing patent specification, yet do exist in the patent and/or non-patent documents found during the course of USPTO searching, Applicant(s) incorporate all such functionally corresponding structures and related enabling material herein by reference for the purpose of providing explicit structures that implement the functional means claimed. Applicant(s) request(s) that fact finders during any claims construction proceedings and/or examination of patent allowability properly identify and incorporate only the portions of each of these documents discovered during the broadest interpretation search of 35 USC § 112(6) (post AIA 112(f)) limitation, which exist in at least one of the patent and/or non-patent documents found during the course of normal USPTO searching and or supplied to the USPTO during prosecution. Applicant(s) also incorporate by reference the bibliographic citation information to identify all such documents comprising functionally corresponding structures and related enabling material as listed in any PTO Form-892 or likewise any information disclosure statements (IDS) entered into the present patent application by the USPTO or Applicant(s) or any 3rd parties. Applicant(s) also reserve its right to later amend the present application to explicitly include citations to such documents and/or explicitly include the functionally corresponding structures which were incorporate by reference above.

Thus, for any invention element(s)/structure(s) corresponding to functional claim limitation(s), in the below claims, that are interpreted under 35 USC § 112(6) (post AIA 112(f)), which is/are not explicitly disclosed in the foregoing patent specification, Applicant(s) have explicitly prescribed which documents and material to include the otherwise missing disclosure, and have prescribed exactly which portions of such patent and/or non-patent documents should be incorporated by such reference for the purpose of satisfying the disclosure requirements of 35 USC § 112 (6). Applicant(s) note that all the identified documents above which are incorporated by reference to satisfy 35 USC § 112 (6) necessarily have a filing and/or publication date prior to that of the instant application, and thus are valid prior documents to incorporated by reference in the instant application.

Having fully described at least one embodiment of the present invention, other equivalent or alternative methods of implementing cooling systems for electronic devices incorporating the spraying of liquid coolant in a longitudinal direction along heat sink(s) according to the present invention will be apparent to those skilled in the art. Various aspects of the invention have been described above by way of illustration, and the specific embodiments disclosed are not intended to limit the invention to the particular forms disclosed. The particular implementation of the cooling systems may vary depending upon the particular context or application. By way of example, and not limitation, the cooling systems described in the foregoing were principally directed to implementations meant to cool computer servers and cryptocurrency farm applications; however, similar techniques may instead be applied to other types of applications such as, but not limited to, various different types of electronics and electronic systems. batteries in electric vehicles, other systems with large batteries, and mechanical systems utilizing heat sinks to dissipate heat, which implementations of the present invention are contemplated as within the scope of the present invention. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

Claim elements and steps herein may have been numbered and/or lettered solely as an aid in readability and understanding. Any such numbering and lettering in itself is not intended to and should not be taken to indicate the ordering of elements and/or steps in the claims.

The corresponding structures, materials, acts, and equivalents of all means or step plus function elements in the claims below are intended to include any structure, material, or act for performing the function in combination with other claimed elements as specifically claimed.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The Abstract is provided to comply with 37 C.F.R. Section 1.72(b) requiring an abstract that will allow the reader to ascertain the nature and gist of the technical disclosure. That is, the Abstract is provided merely to introduce certain concepts and not to identify any key or essential features of the claimed subject matter. It is submitted with the understanding that it will not be used to limit or interpret the scope or meaning of the claims.

The following claims are hereby incorporated into the detailed description, with each claim standing on its own as a separate embodiment.

Only those claims which employ the words "means for" or "steps for" are to be interpreted under 35 USC 112, sixth paragraph (pre-AIA) or 35 USC 112(f) post-AIA. Otherwise, no limitations from the specification are to be read into any claims, unless those limitations are expressly included in the claims.

What is claimed is:

1. A system comprising:
   a heat exchanger or pump section;
   a spray cooling section, wherein said spray cooling section means for cooling an electronic equipment;
   means for separating said heat exchanger or pump section from said spray cooling section;
   means for transferring heat generated by the electronic equipment to at least one of a fluid medium and a liquid coolant;
   means for spraying said liquid coolant along said heat transferring means to transfer heat from the electronic equipment to said liquid coolant;
   wherein said heat transferring means is in an essentially vertical position so that said liquid coolant generally flows downward and is drained by gravity;
   means for collecting said liquid coolant sprayed length is along said heat transferring means;
   means for suctioning the collected liquid coolant;
   means for connecting said collecting means to said liquid coolant spraying means;
   means for pumping said dielectric liquid coolant from said sprayed liquid coolant collecting means and through said liquid coolant spraying means; and
   means for housing said system.

2. A method for cooling an electronic equipment comprising steps for:
   separating, with a divider, a heat exchanger section from a spray cooling section;
   spraying, with one or more sprayers a first liquid coolant effectively downward along one or more fins of one or more heat sinks in the spray cooling section;
   wherein said heat transferring means is positioned typically vertically so that said first liquid coolant at least one of, commonly flows downward and drained by gravity;
   collecting with a reservoir, the first liquid coolant sprayed along the one or more fins of the one or more heat sinks;
   suctioning, via a circulation pump into a pump suction port of the heat exchanger section, the collected liquid coolant in the reservoir; and
   pumping the coolant liquid collected from the reservoir into a heat exchanger device to re-cool the coolant liquid before being recirculated to the one or more sprayers.

3. The method of claim 2, further comprising the steps for pumping the coolant liquid out through the pump discharging port into a spraying coolant heat exchanger inlet.

4. The method of claim 3, further comprising the steps for pumping a second or cold coolant liquid into a spraying coolant supply line, which is connected to a coolant supply header.

5. The method of claim 4, further comprising the steps for distributing the coolant liquid from the coolant supply header to spray coolant sub supply lines.

6. A system comprising:
   a heat exchanger section;
   a spray cooling section;
   a divider, wherein said divider is operable for separating said heat exchanger section and said spray cooling section;
   one or more heat sinks for effectively transferring heat generated by an electronic equipment to at least one of a fluid medium and a liquid coolant;
   one or more fins disposed in said one or more heat sinks;
   at least one or more sprayers, said one or more sprayers being configured to spray the fluid medium or liquid coolant liquid effectively downward on said one or more fins of the one or more heat sinks in the spray cooling section; and
   a reservoir, wherein said reservoir is configured to collect said liquid coolant sprayed on said one or more heat sinks.

7. The system of claim 6, further comprising a pump suction port of the heat exchanger section.

8. The system of claim 7, further comprising a circulation pump for suctioning said liquid coolant collected in said reservoir to said pump suction port of the heat exchanger section.

9. The system of claim 8, further comprising a pump discharging port.

10. The system of claim 9, further comprising a spraying coolant heat exchanger inlet.

11. The system of claim 10, further comprising a heat exchanger device that is configured to re-cool the coolant liquid.

12. The system of claim 11, wherein said circulation pump is further configured to pump the coolant liquid out through said pump discharging port into said spraying coolant heat exchanger inlet to be re-cooled in said heat exchanger device.

13. The system of claim 6, further comprising a coolant heat exchanger outlet.

14. The system of claim 13, further comprising a coolant supply header.

15. The system of claim 14, further comprising a one or more spray coolant sub supply lines into engagement with said coolant supply header.

16. The system of claim 15, wherein a cold coolant liquid from the coolant supply header is distributed into said at least one or more spray coolant sub supply lines to be sprayed through said at least one or more sprayers.

17. The system of claim 6, further comprising a coolant supply header.

18. The system of claim 17, further comprising at least one or more spray coolant sub supply lines, wherein a cold coolant liquid from the coolant supply header is distributed into the at least one or more spray coolant sub supply lines to be sprayed through the at least one or more sprayers.

19. The system of claim 18, further comprising a dripless connector outlet for supplying a second fluid.

20. The system of claim 19, further comprising a dripless connector inlet for receiving said second fluid.

* * * * *